(12) United States Patent
Chinn et al.

(10) Patent No.: US 6,902,947 B2
(45) Date of Patent: Jun. 7, 2005

(54) INTEGRATED METHOD FOR RELEASE AND PASSIVATION OF MEMS STRUCTURES

(75) Inventors: Jeffrey D. Chinn, Foster City, CA (US); Rolf A. Guenther, Monte Sereno, CA (US); Michael B. Rattner, Santa Clara, CA (US); James A. Cooper, San Jose, CA (US); Toi Yue Becky Leung, Sunnyvale, CA (US); Claes H. Bjorkman, Los Altos, CA (US)

(73) Assignee: Applied Materials, Inc., Santa Claa, CA (US)

( * ) Notice: Subject to any disclaimer, the term of this patent is extended or adjusted under 35 U.S.C. 154(b) by 0 days.

(21) Appl. No.: 10/435,757

(22) Filed: May 9, 2003

(65) Prior Publication Data

US 2004/0033639 A1 Feb. 19, 2004

Related U.S. Application Data

(63) Continuation-in-part of application No. 10/300,970, filed on Nov. 20, 2002, now Pat. No. 6,830,950, which is a continuation-in-part of application No. 09/850,923, filed on May 7, 2001, now Pat. No. 6,576,489.

(51) Int. Cl.[7] .............................................. H01L 21/00
(52) U.S. Cl. ........................ 438/48; 438/50; 118/719; 118/722; 118/723 R
(58) Field of Search ........................ 428/447; 438/48, 438/50; 156/345; 118/600, 719, 722, 723 R, 715

(56) References Cited

U.S. PATENT DOCUMENTS

| | | |
|---|---|---|
| 5,079,600 A | 1/1992 | Schnur et al. .................. 357/4 |
| 5,403,665 A | 4/1995 | Alley et al. .................. 428/447 |
| 5,429,708 A | 7/1995 | Linford et al. ................ 216/66 |
| 5,537,083 A | 7/1996 | Lin et al. .................... 333/186 |
| 5,694,740 A | 12/1997 | Martin et al. ................. 53/431 |

(Continued)

FOREIGN PATENT DOCUMENTS

WO    WO 01/58655    8/2001    ........... B29C/41/02

OTHER PUBLICATIONS

Almanza–Workman et al., "Wettability modification of polysilicon for stiction reduction in silicon based micro–electromechanical structures", Diffusion and Defect Data, Part B, Solid State Phenomena, vol. 76–77, pp. 23–26 (2001).

Ashurst et al., "Dichlordimethaylsilane as an anti–stiction monolayer for MEMS—a comparision to the octadecyl-trichlorosilane self–assembled monolayer", Journal of Microelectromechanical Systems, vol. 10, No. 10, pp. 41–49 (Mar. 2000).

Ashurst et al., "Alkene Based Monolayer Films as Anti–Stiction Coatings for Polysilicon Mems", Solid– State Sensor and Actuator Workshop, pp. 320–323 (2000).

(Continued)

Primary Examiner—Hsien-Ming Lee
(74) Attorney, Agent, or Firm—Shirley L. Church

(57) ABSTRACT

Disclosed herein is a method of improving the adhesion of a hydrophobic self-assembled monolayer (SAM) coating to a surface of a MEMS structure, for the purpose of preventing stiction. The method comprises treating surfaces of the MEMS structure with a plasma generated from a source gas comprising oxygen and, optionally, hydrogen. The treatment oxidizes the surfaces, which are then reacted with hydrogen to form bonded OH groups on the surfaces. The hydrogen source may be present as part of the plasma source gas, so that the bonded OH groups are created during treatment of the surfaces with the plasma. Also disclosed herein is an integrated method for release and passivation of MEMS structures which may be adjusted to be carried out in a either a single chamber processing system or a multi-chamber processing system.

10 Claims, 9 Drawing Sheets

U.S. PATENT DOCUMENTS

| | | | |
|---|---|---|---|
| 5,855,681 A | 1/1999 | Maydan et al. | 118/719 |
| 5,869,135 A | 2/1999 | Vaeth et al. | 427/255 |
| 6,027,571 A | 2/2000 | Kikuyama et al. | 134/3 |
| 6,046,966 A | 4/2000 | Drake et al. | 369/13 |
| 6,096,149 A | 8/2000 | Hetrick et al. | 156/155 |
| 6,114,044 A | 9/2000 | Houston et al. | 428/447 |
| 6,144,099 A | 11/2000 | Lopatin et al. | 430/324 |
| 6,153,530 A | 11/2000 | Ye et al. | 438/720 |
| 6,159,540 A | 12/2000 | Menon et al. | 427/220 |
| 6,200,882 B1 | 3/2001 | Drake et al. | 438/464 |
| 6,224,312 B1 | 5/2001 | Sundar | 414/217 |
| 6,265,026 B1 | 7/2001 | Wang | 427/248.1 |
| 6,325,490 B1 | 12/2001 | Yang et al. | 347/45 |
| 6,691,068 B1 * | 2/2004 | Freed et al. | 702/187 |
| 2002/0072016 A1 | 6/2002 | Chen et al. | 430/323 |
| 2003/0045098 A1 | 3/2003 | Verhaverbeke | 438/689 |

OTHER PUBLICATIONS

Bhushan, "Tribology on the macroscale to nanoscale of microelectromechanical system materials: a review", Journal of Engineering Tribology, vol. 215, No. J1, Proceedings of the Institute of Mechanical Engineers, Part J, pp. 1–18 (2001).

Bustillo et al., "Surface Micromachining for Microelectromechanical Systems", Proceedings of the IEEE, vol. 86, No. 8, pp. 1552–1573 (1998).

Houston et al., "Ammonium Fluoride Anti–Stiction Treatments for Polysilicon Microstructures", Transducers '95—Eurosensors IX, The $8^{th}$ International Conference on Solid–State Sensors and Actuators, and Eurosensors IX, pp. 210–213 (1995).

Houston, "Surface Treatments for Adhesion Reduction in Polysilicon Micromechanical Devices", Dissertation Abstracts International, vol. 5802B, p. 837 (1996).

Howe et al., "Silicon micromechanics: sensors and actuators on a chip", IEEE Spectrum, pp. 29–35 (Jul. 1999).

B. Kim et al., "A New Class of Surface Modifiers for Stiction Reduction", IEEE, pp. 189–193 (1999).

Kim et al., "A New Organic Modifier for Anti–Stiction", Journal of Microelectromechanical Systems, vol. 13, No. 1, pp. 33–40 (Mar. 2001).

Komvopolous et al., "Surface texturing and chemical treatment methods for reducing high adhesion forces at micromachine interfaces", Proceedings of the SPID—The International Society for Optical Engineering, vol. 3512, pp. 106–122 (1998).

Lee et al., "Fabrication of Surface Micromachined Polysilicon Actuators Using Dry Release Process of HF Gas–Phase Etching", IEEE, pp. 30.1.1–30.1.4 (1996).

Lee et al., "Dry Release for Surface Micromachining with HF Vapor–Phase Etching", IEEE, vol. 6, No. 3, pp. 226–233 (1997).

Lee et al., "Layer–by–Layer Assembly of Zeolite Crystals on Glass with Polyelectrolytes as Ionic Linkers", J. Am. Chem. Soc., vol. 123, pp.9769–9779 (2001).

Man et al., "Elimination of Post–Release Adhesion in Microstructures Using Conformal Fluorocarbon Coatings", IEEE, vol. 6, No. 1, pp. 25–34 (1997).

Y. Matsumoto et al., "Fluorocarbon film for protection from alkaline etchant and elimination of in–use stiction", 1997 International Conference on Solid–State Sensors and Actuators, pp. 695–698 (1997).

Matsumoto et al., "Novel prevention method of stiction using silicon anodization for SOI structure", Elsevier Science S.A., pp. 106–122 (1999).

Mayer et al., "Chemical vapor deposition of fluoroalkylsilane monolayer films for adhesion control in microelectromechanical systems", Journal of Vacuum Science & Technology B, vol. 18, No. 5, pp. 2433–2440 (Sep/Oct 2000).

Senkevich et al., "Plasma enhanced chemical vapor deposition of fluorocarbon thin films via $CF_3H/H_2$ chemistries: Power, Pressure, and feed stock composition studies", J. Vac. Sci. Technol. A, vol. 18, No. 2, pp. 377–384 (Mar/Apr 2000).

Smith et al., Thin Teflon–Like Films for Eliminating Adhesion in Released Polysilicon Microstructures, International Conference on Solid–State Sensors and Actuators, pp. 245–248 (1997).

Srinivasan et al., "Self–Assembled Fluorocarbon Films for Enhanced Stiction Reduction", IDDD, 1997 International Conference on Solid–State Sensors and Actuators, pp. 1399–1402.

Srinivasan et al., "Alkyltrichlorosilane–Based Self–Assembled Monolayer Films for Stictoin Reduction in Silicon Micromachines", IEEE, vol. 6, No. 2, pp. 252–260 (1998).

U.S. Appl. No. 60/415,196, filed Sep. 30, 2002, entitled "Processing Chamber for Fabricating Microstructure Devices".

* cited by examiner

INTEGRATED METHOD FOR RELEASE AND PASSIVATION OF MEMS STRUCTURES

STATEMENT OF RELATED APPLICATION

This application is a continuation-in-part of Ser. No. 10/300,970 filed Nov. 20, 2002 now U.S. Pat. No. 6,830,950 which is a CIP of U.S. patent application Ser. No. 09/850, 923, filed May 7, 2001 now U.S. Pat. No. 6,576,489.

FIELD OF THE INVENTION

In general, the present invention is an integrated method for release and passivation of MEMS (micro-electromechanical systems) structures. In addition, a method of improving the adhesion of a hydrophobic self-assembled monolayer (SAM) coating to a surface of a MEMS structure is described, where the SAM is used to prevent stiction. The invention also pertains to the use a single chamber processing system to carry out the integrated release and passivation method, or to the use of a multi-chamber processing system which provides greater processing efficiencies.

BRIEF DESCRIPTION OF THE BACKGROUND ART

Micromachining technology compatible with semiconductor processes is used to produce a number of devices such as piezoelectric motors containing cantilever beams, hinges, accelerometers, reflector antennae, microsensors, microactuators, and micromirrors, for example. One of the most popular microactuators is an electrostatic comb driver, due to its simplicity in fabrication and low power consumption. Surface micromachining fabrication processes for the electrostatic comb driver, as well as other beams and lever arms, have problems with stiction of such beams and lever arms to an underlying layer over which the beam or arm extends. The lever arm becomes deformed from its intended position, so that it does not extend out as desired. In the case of a membrane or diaphragm, the membrane or diaphragm becomes deformed from its intended position and may become stuck to an adjacent surface. Stiction is the number one yield-limiting problem in the production of the kinds of devices described above.

FIGS. 1A through 1C are simple schematics showing a cross-sectional side view of a starting structure for surface machining of a lever arm, the desired machined lever arm, and a lever arm which has been rendered non-functional due to stiction, respectively.

The FIG. 1A structure shows a substrate layer 102 (typically single crystal silicon), a portion of which is covered with a sacrificial layer 104 (typically silicon oxide), and a lever arm layer 106 (typically polysilicon) which is in contact with and adhered to substrate layer 102 at one end of lever arm layer 106. FIG. 1B shows the FIG. 1A structure after the removal of sacrificial layer 104 to produce the desired free-moving lever arm 107. The height "h" of gap 108 between lever arm 107 and substrate 102, the length "l", and the cross-sectional thickness "t" of the lever arm 107 depend on the particular device in which the structure is employed. In many instances the relative nominal values of "h", "l", and "t" are such that capillary action during the fabrication process; or contaminants formed as byproducts of the fabrication process; or van der Waals forces; or electrostatic charges on the upper surface 110 of substrate layer 102 and/or on the undersurface 112 of lever arm layer 106, may cause lever arm 106 to become stuck to the upper surface 110 of substrate layer 102. This problem is referred to as "stiction", and is illustrated in FIG. 1C. Stiction may occur during formation of the lever arm 107, or may occur subsequent to fabrication of the device and during packaging, shipment, or use (in-use stiction) of the device. A single crystal silicon or polysilicon surface of the kind which is frequently used to fabricate a lever arm, beam, membrane, or diaphragm is hydrophilic in nature, attracting moisture, which may cause stiction.

Stiction, which is the primary cause of low yield in the fabrication of MEMS devices, is believed to result from a number of sources, some of the most significant being capillary forces, surface contaminants, van der Waals forces, and electrostatic attraction. Factors which may contribute to stiction include: warpage due to residual stresses induced from materials; liquid-to-solid surface tension which induces collapse; drying conditions during processing; adverse and harsh forces from wet baths; aggressive designs (i.e., long and thin beams); surface-to surface attractions; inadequate cleaning techniques; aggressive cleaning techniques; and environments subsequent to fabrication, including packaging, handling, transportation, and device operation.

Various processes have been developed in an attempt to prevent stiction from occurring during fabrication of micromachined arms and beams. To reduce the possibility of stiction subsequent to release of a beam, lever arm, membrane, or diaphragm (so that it extends over open space), a surface treatment may be applied and/or a coating may be applied over freestanding and adjacent surfaces. For example, in U.S. Pat. No. 6,096,149, to Hetrick et al, issued Aug. 1, 2000, the inventors disclose a method for fabricating an adhesion-resistant microelectromechanical device. Amorphous hydrogenated carbon is used as a coating or structural material to prevent adhesive failures during the formation and operation of a microelectromechanical device. (Abstract) The amorphous hydrogenated carbon (AHC) coating is applied on the micromachined device after removal of the sacrificial layer and release of the structure. The sacrificial layer is removed in a wet etching solution such as hydrofluoric acid or buffered HF acid. (Col. 7, lines 26–32.) The method is said to reduce adhesive forces between microstructure surfaces by altering their surface properties. The AHC is said to create a hydrophobic surface, which results in lower capillary forces and an associated reduction in stiction. (Col. 2, lines 66–67, continuing at Col. 3, lines 1–4.)

U.S. Pat. No. 5,403,665, issued Apr. 4, 1995, to Alley et al., discloses a method of applying a self-assembled alkyltrichlorosilane monolayer lubricant to micromachines. Octadecyltrichlorosilane (OTS; $C_{18}H_{37}SiCl_3$) is provided as an example of an alkyltrichlorosilane. In a dilute, non-polar, non-aqueous solution, OTS will deposit on silicon, polysilicon, and silicon nitride surfaces that have been previously treated to form a hydrophilic chemical oxide. Treatment of the silicon, polysilicon, or silicon nitride surfaces may be accomplished with an approximately 5 to 15 minute exposure to a hydrophilic chemical oxide promoter such as Piranha ($H_2O_2$:$H_2SO_4$), RCA SC-1, or room temperature $H_2O_2$. This treatment changes silicon and polysilicon surfaces from hydrophobic to hydrophilic. Thus, the surface will have a thin layer of adsorbed water. The OTS reacts with the thin adsorbed water layer that is present on the treated surface to form a single layer of molecules that are chemically bonded to the surface. (Col. 3, lines 23–40; Col. 4, lines 19–30)

SUMMARY OF THE INVENTION

The present invention pertains to the formation of a hydrophobic, self-assembled monolayer (SAM) coating on a surface of a MEMS (micro-electro-mechanical systems) structure, for the purpose of preventing stiction. In particular, the invention pertains to a method of improving the adhesion of a SAM coating to a surface of a MEMS structure, to produce a hydrophobic surface on the MEMS structure.

Self-assembled monolayer (SAM) coatings are known in the art. Self-assembly is a process in which a single, densely packed molecular layer of a material is selectively deposited on a fresh reactive surface. The process self-terminates after single layer coverage is achieved. SAM coatings are typically deposited from precursor long-chain hydrocarbons or fluorocarbons with a chlorosilane-based head, such as alkylchlorosilanes. Effective alkylchlorosilanes include OTS (octadecyltrichlorosilane; $C_{18}H_{37}SiCl_3$), FDTS (perfluorodecyltrichlorosilane; $C_{10}H_4F_{17}SiCl_3$), and DMDS (dimethyldichlorosilane; $(CH_3)_2SiCl_2$), by way of example, and not by way of limitation. The chemical structures of OTS and FDTS are shown in FIG. 2A (respectively indicated by reference numerals 200 and 210).

To improve adhesion, prior to the application of a SAM coating, oxidizable surfaces of a MEMS structure are treated with a plasma which was generated from a source gas comprising oxygen and, optionally, a source of hydrogen. The treatment oxidizes the oxidizable surfaces, which are then further reacted with hydrogen to form bonded OH groups on the surfaces. The hydrogen source may be present as part of the plasma source gas, so that the bonded OH groups are created during treatment of the surfaces with the plasma. Examples of hydrogen sources include $NH_3$ or steam, by way of example and not by way of limitation. In the alternative, the plasma-treated, oxidized surfaces may be subsequently exposed to a gas containing a source of hydrogen, such as a mixture of hydrogen with an inert gas, or $NH_3$, so that the oxidized surface reacts with the hydrogen to create bonded OH groups on the MEMS surfaces.

The plasma used to oxidize the MEMS structure surface should have a plasma density of about $1\times10^8$ $e^-/cm^3$ or less at the substrate surface, and the plasma treatment should be carried out without a bias applied to the substrate. Typically, the plasma density is within the range of about $1\times10^7$ $e^-/cm^3$ to about $1\times10^8$ $e^-/cm^3$ at the substrate surface.

Typically, the plasma used to treat the MEMS structure surfaces is an externally generated plasma. The use of an external plasma generation source provides the ability to control the plasma to exhibit a low, yet uniform, ion density, preventing undesirable etching and/or ion bombardment of the MEMS structure surface during oxidation of the surface. The plasma pretreatment process of the invention is a very gentle, isotropic process which is performed for the sole purpose of preparing the surface for reaction with a SAM precursor. The surfaces may be silicon-containing surfaces or other surfaces within a MEMS structure, including, but not limited to, oxidizable metal-containing surfaces. The highly isotropic process allows all exposed surfaces of the MEMS structure to be contacted with the plasma.

Oxygen typically makes up about 20 volume % to about 100 volume % of the reaction-generating portion of the plasma source gas. The source of hydrogen is typically $NH_3$ or steam, by way of example, and not by way of limitation. If $NH_3$ is used, the $NH_3$ typically makes up about 0.1 volume % to about 20 volume % of the reaction-generating portion of the plasma source gas. More typically, the $NH_3$ makes up about 0.5 volume % to about 10 volume % of the reaction-generating portion of the plasma source gas. The presence of nitrogen in the plasma source gas speeds up the rate of oxidation. Nitrogen ($N_2$) may be present at about 20 volume % to about 80 volume % of the reaction-generating portion of the plasma source gas.

The plasma source gas may also include a nonreactive diluent gas, such as argon, helium, neon, xenon, krypton, and combinations thereof, for example, and not by way of limitation. The nonreactive diluent gas typically makes up about 20 volume % to about 80 volume % of the plasma source gas, with the remaining 80 volume % to 20 volume % being the reaction-generating portion of the plasma source gas.

FIG. 2A shows one example of a precursor 210 to a SAM coating, which is reacted with the surface 220 shown in FIG. 2B, to produce a SAM, as shown in FIG. 2C. FIG. 2B shows a hydrolyzed surface 220 of a MEMS structure. During formation of a SAM coating, the chlorosilane-based head of an alkylchlorosilane, shown as 212 in FIG. 2A, is reacted with a hydrolyzed surface, shown as 220 in FIG. 2B, liberating one molecule of HCl for each Si—Cl bond that is hydrolyzed. FIG. 2C shows a MEMS surface 230 on which a self-assembled monolayer of individual FDTS molecules 210 has been grown. A similar structure may be achieved for a self-assembled monolayer of individual OTS molecules. The SAM coatings formed in this manner are hydrophobic, and repel moisture which may cause stiction.

Formation of a SAM coating on a MEMS substrate is a very important step in an integrated method for release and passivation of a MEMS structure. The integrated method includes a number of MEMS structure processing steps which are carried out prior to application of the SAM. According to the integrated process, a substrate including at least one MEMS structure is loaded into a processing chamber. At least one processing step is used to remove moisture, particles, and other contaminants present on the substrate surface prior to carrying out the MEMS release step. Just prior to the release step, the substrate surface is typically contacted with a plasma which is generated from a source gas comprising oxygen, to clean the substrate surface. A release process is then performed, during which a sacrificial layer present within the MEMS structure is removed. The release process is typically a cyclic etch/cleaning procedure, where release is accomplished either by plasma etch or by plasmaless vapor etching of the sacrificial layer material, followed by a cleaning step in which byproducts from the etch process and other contaminants which may lead to stiction are removed. The cleaning procedure may make use of a plasma treatment or a volatile gas flow over the etched surface, or a combination of these techniques. The etch/clean cycles are performed until the sacrificial layer is removed, releasing the movable portion of the structure.

After the release process is complete, it is necessary to "passivate" (treat) the MEMS structure surfaces in a manner which essentially prevents stiction. One of the preferred methods of passivation is the formation of a coating of a polymeric material over the MEMS structure surfaces, which polymeric coating prevents stiction. One of the preferred polymeric coatings is a hydrophobic, self-assembled monolayer (SAM), as this provides a method of controlling the thickness of the anti-stiction coating. Prior to application of a SAM, it is necessary to prepare the surface of the MEMS structure to chemically bond to the SAM precursor. An excellent anti-stiction SAM coating can be produced using an alkylchlorosilane precursor of the kind previously described herein. This precursor requires the presence of hydroxyl (—OH) groups on the MEMS structure surface to permit bonding of the alkylchlorosilane precursor to form the SAM, as shown in FIGS. 2A through 2C. To provide the bonded hydroxyl groups on the MEMS substrate surface, the surfaces of the MEMS structure are contacted with a plasma generated from a source gas comprising oxygen and, optionally, a source of hydrogen, as previously described. The hydrogen source may be present as part of the plasma source gas, so that the bonded OH groups are created during treatment of the surfaces with the plasma. Examples of hydrogen sources include $NH_3$ or steam, by way of example and not by way of limitation. In the alternative, the plasma-treated, oxidized surfaces may be subsequently exposed to a gas containing a source of hydrogen, such as a mixture of hydrogen with an inert gas, or $NH_3$, so that the oxidized surface reacts with the hydrogen to create bonded OH groups on the MEMS surfaces.

After creation of the bonded hydroxyl groups on the MEMS structure surfaces, excess oxidant and reaction by-products are typically removed using a volatile solvent, and even more typically using a series of two or more volatile solvents. To remove the excess oxidant and reaction by-products, which are polar in nature, it is advantageous to use a volatile polar organic solvent, such as an alcohol, acetone, or ketone, by way of example and not by way of limitation. The volatile polar organic solvent typically contains less than 10 carbon atoms. Such a volatile polar organic solvent effectively removes water or other small OH-containing moieties, which could react with a SAM precursor to produce residues which are not easily removed from the MEMS structure surfaces. However, the polar organic solvent can also interfere with the subsequent reaction of the SAM precursors with the —OH groups on the MEMS surface. With this in mind, a second volatile organic solvent which is less polar in nature, such as an aliphatic solvent or a cycloaliphatic solvent, or combinations thereof, by way of example and not by way of limitation, are used to remove residues of the more polar organic solvent. Again, these less polar solvents typically contain less than 10 carbon atoms. A series of increasingly less polar, volatile organic solvents may be used, if required. The polar organic solvent and the less polar organic solvent may be introduced into a reaction chamber containing the hydroxylated surface of the MEMS structure by, for example, passing an inert gas through liquid-phase solvents to carry the solvents in vapor phase into the reaction chamber. Exemplary inert gases would include the noble gases, helium, neon, argon, krypton, and xenon; and, other gases which would not be sufficiently reactive to affect the performance of the solvents in removing the residues after the oxidation pre-treatment, or to affect the behavior or the MEMS structure surfaces, or to affect the ability of the precursor materials to form a reliable SAM on the MEMS structure surfaces.

The organic solvent system described above for removing oxidation process residues from the MEMS structure surface is also useful in cleaning the interior surfaces of a chamber in which the SAM precursor is applied to the MEMS structure surfaces. This cleaning can remove any water or other polar substance residue from the reaction chamber prior to introduction of a SAM-forming alkysilane-containing molecule into the chamber. This prevents the formation of particulates during the SAM-forming process and keeps the reaction chamber itself clean as well.

Subsequent to formation of the hydroxyl groups, and typically subsequent to solvent cleaning of the MEMS structure surfaces, the surfaces are exposed to a reactant which produces the self-assembled monolayer (SAM) coating.

During application of the SAM coating to surfaces of the MEMS structure, a SAM coating may also form on surfaces within the processing chamber. If the entire integrated release and passivation process is carried out in a single chamber, this SAM coating needs to be removed from surfaces of the processing chamber prior to the performance of other processing steps within the chamber. Therefore, after removal of a substrate from the processing chamber, a chamber cleaning step is typically carried out, in which surfaces of the processing chamber are contacted with a plasma generated from a source gas comprising oxygen, whereby residual SAM is removed from processing chamber surfaces. If the integrated release and passivation process is carried out in a multi-chamber system, a series of substrates maybe processed in the chamber in which the SAM is applied before it is necessary to remove SAM which may have formed on chamber surfaces.

Figure 1A:
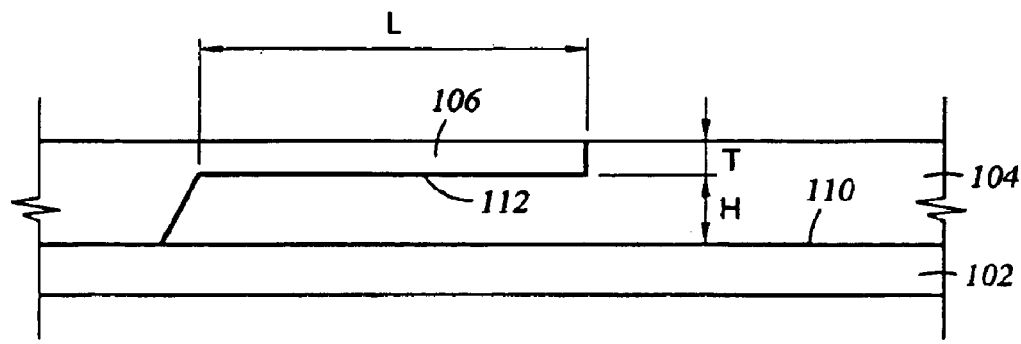
FIGS. 1A through 1C are simple schematics showing, respectively, a starting structure for surface machining of a lever arm, the desired machined lever arm, and a lever arm which has been rendered non-functional due to stiction.

The FIG. 1A schematic structure shows a substrate layer 102, a portion of which is covered with a sacrificial layer 104, and a lever arm layer 106 which is in contact with and adhered to substrate layer 102 at one end of lever arm layer 106.

Figure 1B:
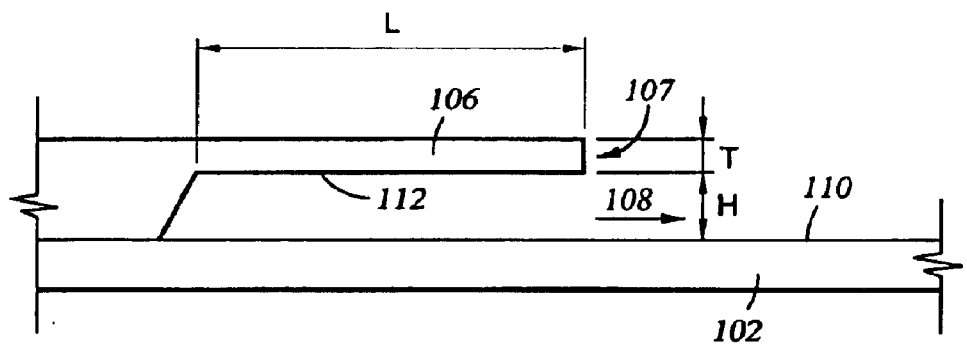

FIG. 1B shows the FIG. 1A schematic structure after the removal of sacrificial layer 104 to produce the desired free-moving lever arm 107.

Figure 1C:
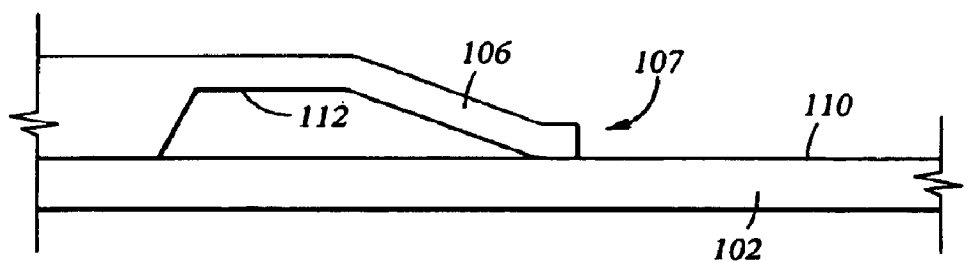

FIG. 1C illustrates a problem which is referred to as "stiction", where, during fabrication of the device including lever arm 107, or subsequent to fabrication and during use of the device, lever arm 107 becomes stuck to an adjacent surface (typically the substrate 102 beneath lever arm 107).

Figure 2A:
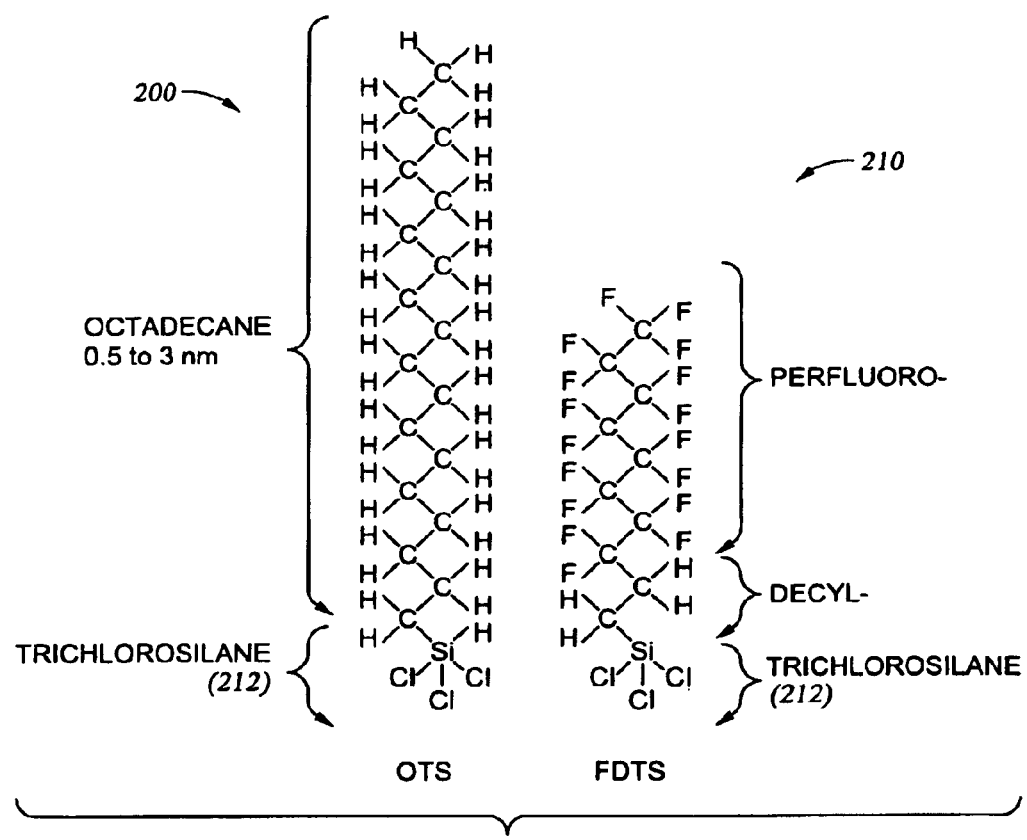

FIG. 2A shows the chemical structures of OTS (octadecyltrichlorosilane; $C_{18}H_{37}SiCl_3$), 200, and FDTS (perfluorodecyltrichlorosilane; $C_{10}H_4F_{17}SiCl_3$), 210, which are precursors for the formation of a SAM.

Figure 2B:
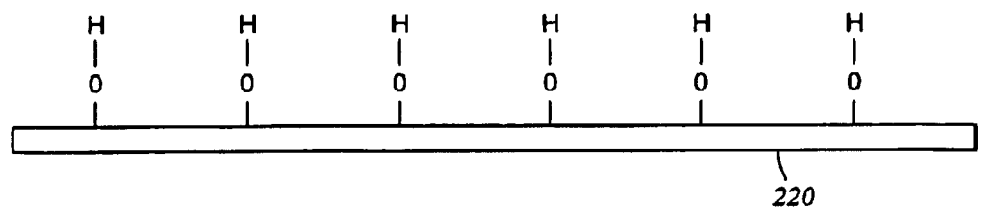

FIG. 2B shows a hydrolyzed surface 220 of a MEMS structure.

Figure 2C:
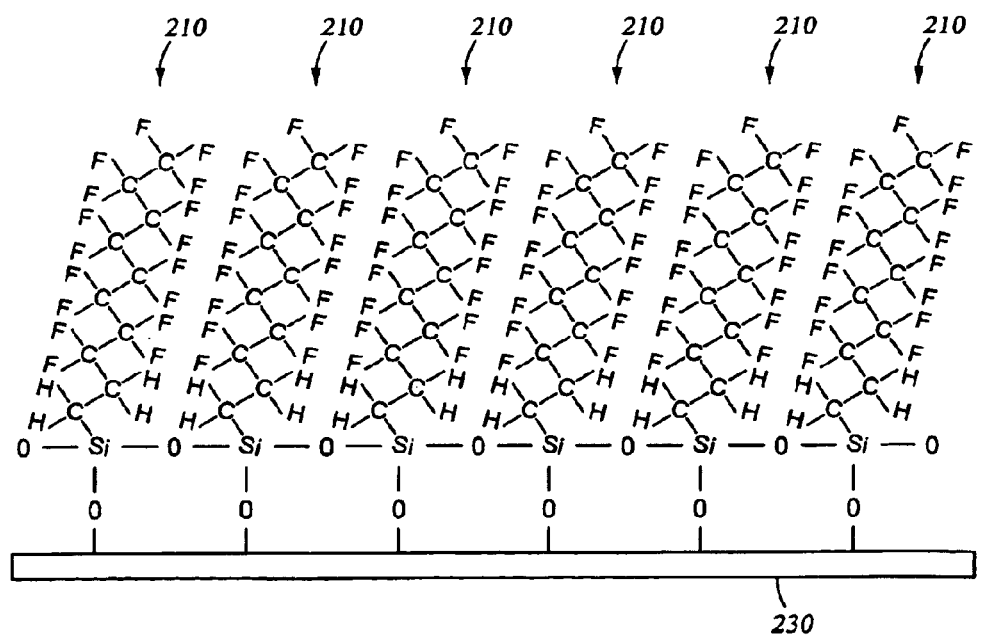

FIG. 2C shows a MEMS surface 230 on which a self-assembled monolayer of individual FDTS molecules 210 has been grown.

Figure 3:
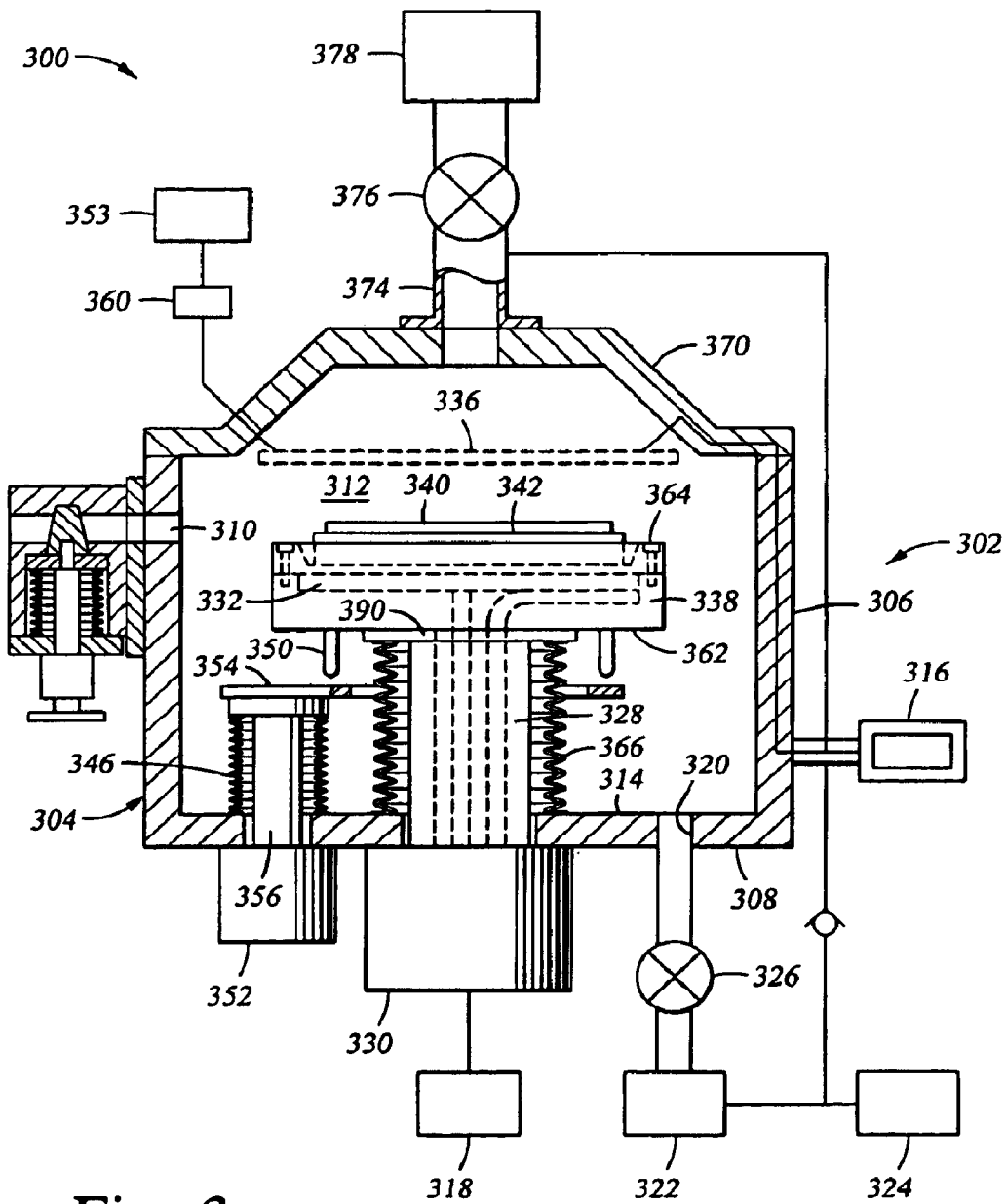

FIG. 3 is a cross-sectional schematic of a single chamber plasma processing system which may be used to carry out the processing described herein.

Figure 4:
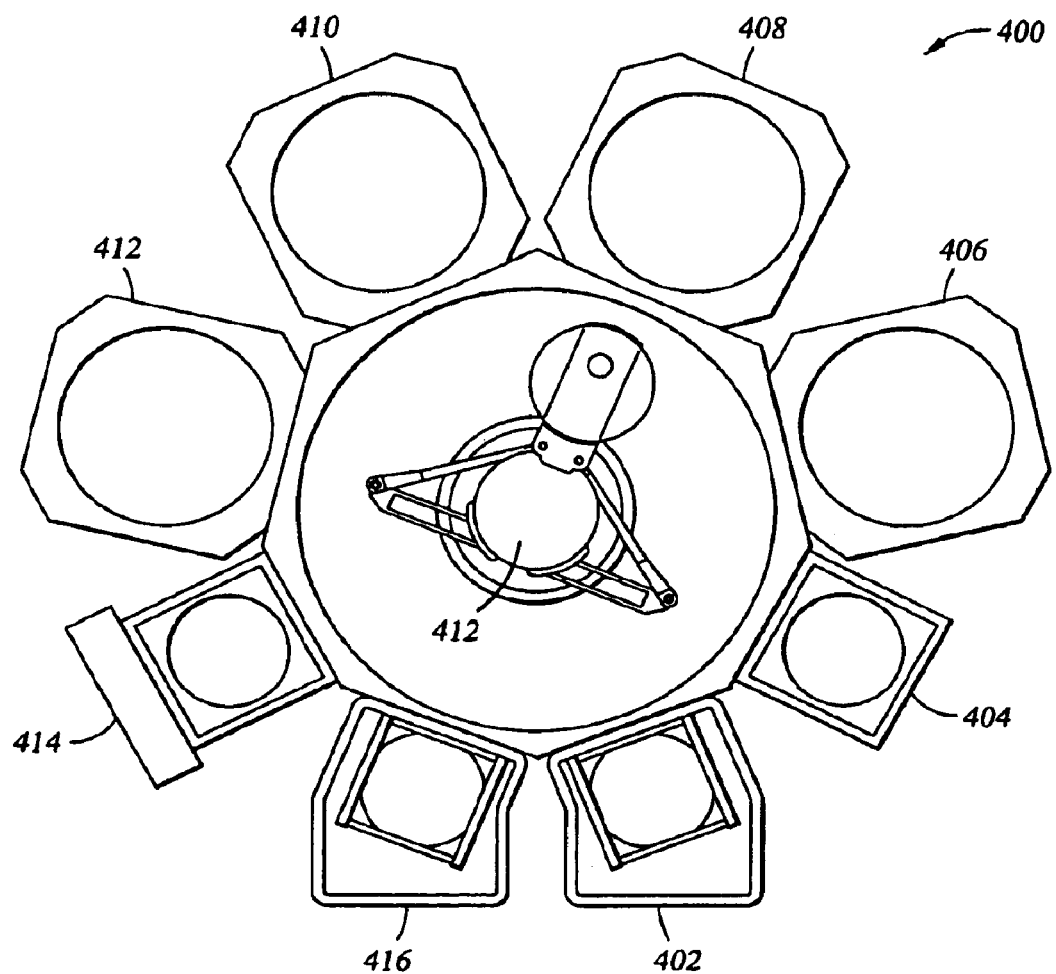

FIG. 4 is a top view schematic of a multi-chamber processing system of the kind which may be used to carry out the processing described herein, a CENTURA®, available from Applied Materials, Inc., Santa Clara, Calif.

Figure 5:
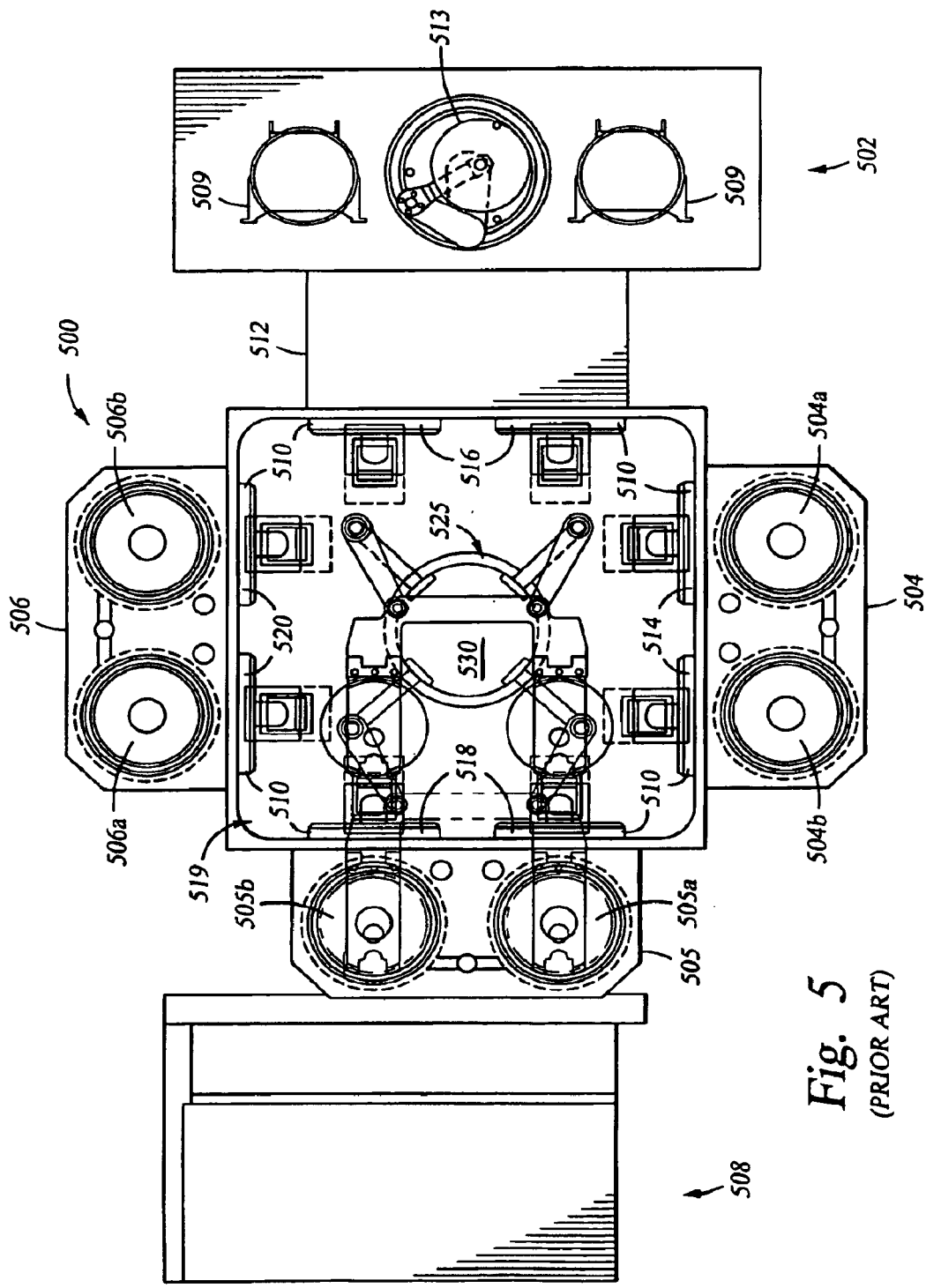

FIG. 5 is a top view schematic of a multi-chamber processing system of the kind which may be used to carry out the processing described herein, a PRODUCER®, available from Applied Materials, Inc., Santa Clara Calif.

Figure 6:
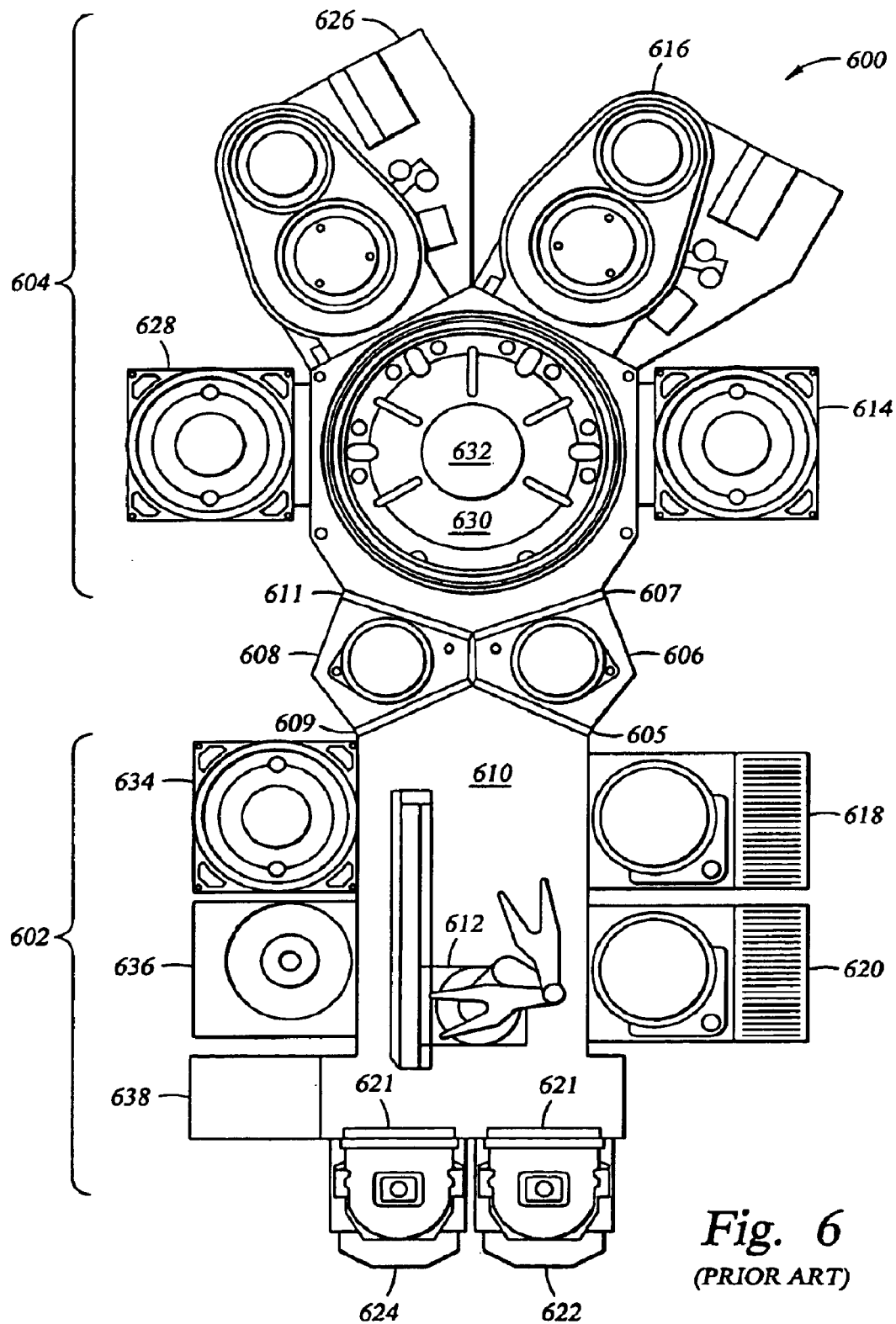

FIG. 6 is a top view schematic of a multi-chamber processing system of the kind which may be used to carry out the processing described herein, an AXIOM™, available from Applied Materials, Inc., Santa Clara, Calif.

Figure 7:
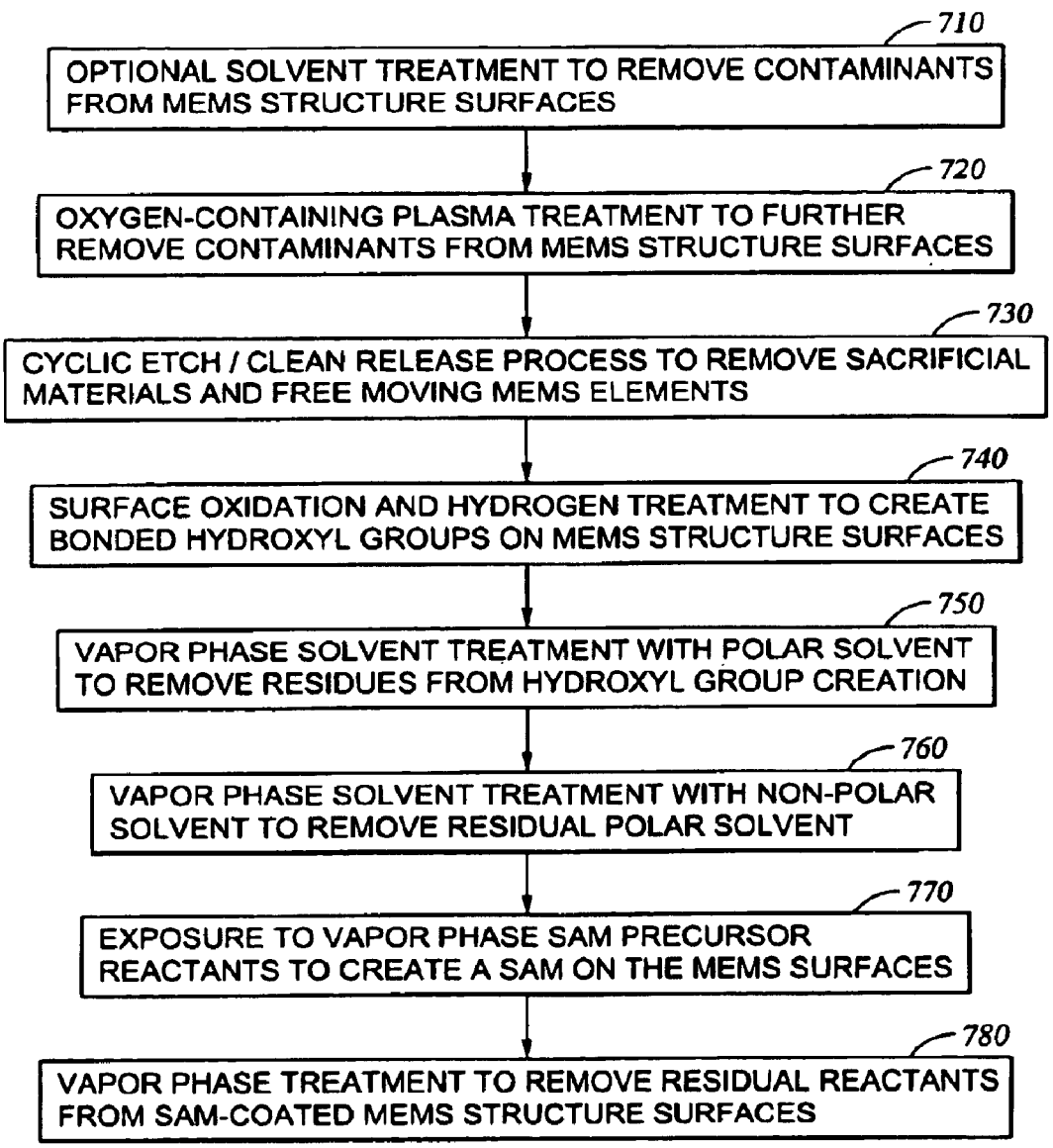

FIG. 7 is a process flow diagram showing one embodiment of the present invention which includes a number of advantageous steps which may be used in release and passivation of a MEMS structure, and which correlates well with the use of a multi-chamber processing system.

Figure 8:
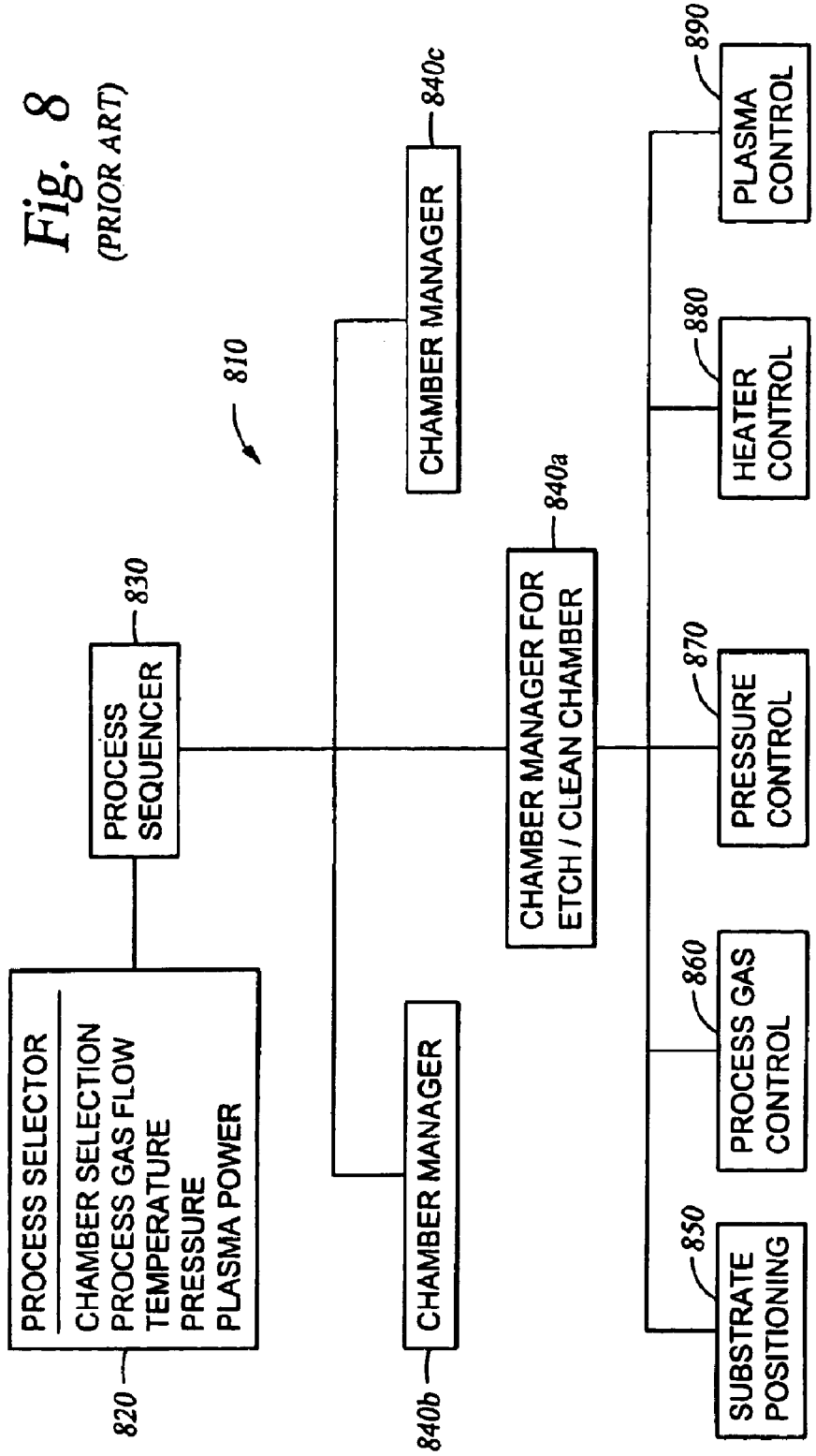

FIG. 8 is an illustrative block diagram of a hierarchical control structure of a computer program for process control, of the kind which may be used with a PRODUCER® processing system.

DETAILED DESCRIPTION OF THE INVENTION

Disclosed herein is an integrated process for release and passivation of MEMS structures which includes formation of a SAM on MEMS surfaces. Exemplary processing conditions for performing various embodiments of the method of the invention are set forth below. In addition, various kinds of processing apparatus which may be used to carry out the method are described along with efficiencies which may be achieved by the use of particular processing apparatus.

As a preface to the detailed description, it should be noted that, as used in this specification and the appended claims, the singular forms "a", "an", and "the" include plural referents, unless the context clearly dictates otherwise.

I. Apparatus for Practicing the Invention

FIG. 3 shows across-sectional schematic of a single chamber plasma processing system of the kind which was used to carry out the experimentation described herein, in order to minimize initial equipment costs. A single chamber processing system is useful when a high throughput rate for the product is not required, such as for research and development work, and in the production of specialty devices which have a more limited market. The system 300 generally includes a processing chamber 302 coupled to a gas delivery system 316. The processing chamber 302 includes a chamber body 304 that has walls 306, a bottom 308, and a lid assembly 370 defining a process volume 312. The process volume 312 is typically accessed through a substrate access port 310 formed through the walls 306 that facilitates movement of a workpiece or substrate 340 into and out of the processing chamber 302. Optionally, the substrate 340 maybe disposed on a carrier 342 that travels with the substrate 340 during processing.

An exhaust port 320 is formed through the wall 306 or bottom 308 of the chamber body 304, and couples the interior volume 312 to a vacuum pumping system 322. A shut-off valve/pressure control valve 326 is typically disposed between the vacuum pumping system 322 and the exhaust port 320 to selectively isolate the vacuum pumping system 322 from the interior volume 312 and to regulate the pressure in 312 when in use. The vacuum pumping system 322 is coupled to a disposal system 324 to condition, recycle, and/or store the gases exiting the chamber body 304.

A temperature-controlled substrate support assembly 338 is centrally disposed within the processing chamber 302. The support assembly 338 supports the substrate 340 (and carrier 342, when used) during processing. In one embodiment, the substrate support assembly 338 has at least one embedded temperature control device 332 (shown in phantom) and a thermocouple 390 disposed therein. The temperature control device 332 and the thermocouple 390 are coupled to a controller 318. The controller 318 utilizes information obtained from the thermocouple 390 to control the temperature control device 332, so that the substrate support assembly 338 and the substrate 340 are maintained at a predetermined temperature during processing.

The substrate support assembly 338 includes a plurality of lift pins 350 disposed therethrough. The lift pins 350 are typically comprised of ceramic or anodized aluminum. A lift plate 354 is disposed between the substrate support assembly 338 and chamber bottom 308 and is coupled to a lift actuator 352 by a shaft 356. The lift actuator 352 may be energized to elevate the lift plate 354. As the lift plate 354 is elevated, the lift plate 354 contacts the lift pins 350 extending below the substrate support assembly 338 and causes the lift pins to project above the substrate support assembly 338, thus placing the substrate 340 in a spaced-apart relation relative to the substrate support assembly 338 to facilitate substrate hand-off with a transfer robot (not shown). Bellows 346, coupled between the shaft 356 and chamber bottom 306, maintain the isolation of the process volume 312 from the environment exterior to the processing chamber 302 while the elevation of the lift plate 354 is moved.

The support assembly 338 has a lower side 362 and an upper side 364 that supports the substrate 340. The lower side 362 is coupled to a lift mechanism 330 by a stem 328 that passes through the chamber bottom 308. The lift mechanism 330 moves the support assembly 338 between an elevated processing position and a lowered position (as shown) to facilitate substrate transfer through the access port 310. A bellows 366 provides a flexible vacuum seal between the chamber volume 312 and the atmosphere outside the processing chamber 302, while facilitating the movement of the support assembly 338. The stem 328 additionally provides a conduit for electrical and thermocouple leads between the support assembly 338 and other components of the system 300. The support assembly 338 is generally grounded.

The lid assembly 370 is supported by the walls 306 and includes a center port 374 through which process and other gases may be delivered to the interior volume 312 of the process chamber 302. A remote plasma generator 378 is coupled to the center port 374. A control valve 376 is typically disposed between the remote plasma generator 378 and the center port 374 to selectively regulate and isolate the flow from remote plasma generator 378 into the interior volume 312. The remote plasma generator 378 typically provides a cleaning agent, such as fluorine radicals, to clean the interior of the chamber body 304. The remote plasma generator 378 improves chamber life and reduces particle generation by minimizing RF exposure of chamber components during chamber cleaning. The remote plasma generator 378 may be coupled to the gas delivery system 316 to excite certain gases being delivered to the interior volume 312 of the chamber body 304.

An optional distribution plate 336 is coupled the lid assembly 370 below the center port 374. The distribution plate 336 is typically fabricated from aluminum alloy, substantially pure aluminum or nickel alloys. The center section of the distribution plate 336 includes a perforated area through which process and other gases supplied from the gas delivery system 316 are delivered to the process volume 312. The perforated area of the distribution plate 336 is configured to provide uniform distribution of gases passing through the distribution plate 336 into the processing chamber 302.

In one embodiment, RF power is supplied by a power source 353 to the distribution plate 336 (or other electrode positioned within or near the lid assembly of the chamber) to excite the gases disposed in the process volume 312 between the support assembly 338 and the distribution plate 336. The RF power from the power source 353 is generally selected commensurate with the size of the substrate to drive the release process. Typically, a matching circuit 360 is coupled between the power source 353 and distribution plate 336.

A more detailed description and schematics of the plasma processing system shown in FIG. 3 is provided in commonly assigned, copending U.S. Provisional Application Ser. No. 60/415,196, filed Sep. 30, 2002, which is hereby incorporated by reference herein in its entirety.

Although the plasma processing system which was used to process the substrates described herein is shown in schematic in FIG. 3, one skilled in the art may use any plasma processing chamber available in the industry. Preferably, the chamber should be capable of being used in combination with an externally generated plasma source. For example and not by way of limitation, remote plasma generators are commercially available from MKS Instruments, Inc. (Andover, Mass.). In general, the plasma source should be located as close to the processing chamber as possible in order to maintain the etchant species in their ionized state, but far enough away from the chamber to avoid undue physical bombardment of the substrate by the ionized species.

As an alternative to the remote RF plasma generator shown in FIG. 3, the method of the invention may be performed in an apparatus having a microwave plasma generation source located internal to the processing chamber, but a sufficient distance away from the substrate so that ion bombardment of the substrate is minimal.

While a single chamber processing system of the kind described above is useful for carrying out research and development and in the production of specialty devices, where high throughput rate is not required, it does not provide economy of cost in terms of operation. For example, in a multi-chambered/multi-module processing system, by providing more chambers/modules for the processes which take longer, faster processing modules do not sit idle while waiting for a substrate to complete processing in a slower processing module. In addition, it is not necessary to clean the processing module because the next process step to be carried out in the processing module is incompatible with a process step which has just been completed.

The multi-chambered/multi-module processing systems are frequently referred to as cluster tools, because they typically include a number of processing chambers and load locks which provide for substrate entry and exit, all of which are "clustered" around a centralized substrate handling system (usually a robot and frequently a multi-armed robot). The advantages of a cluster tool include: reduced substrate traveling distance, reduced processing system footprint, reduced cycle time, and improved yield. The reduced wafer traveling distance, reduced footprint, and reduced cycle time are a result of the reduced handling of the substrates. The improved yield is a result of the reduced exposure of the substrate surface to ambient atmosphere in the manufacturing facility.

FIG. 4 shows one embodiment of a multi-chambered processing system, as a top view/cross-sectional schematic. In particular, FIG. 4 shows an Applied Materials, Inc. CENTURA® processing platform, which is used to support a fully automated substrate processing system employing a single substrate, multi-chambered design. The system includes a computer-controlled process control system (not shown) which executes software designed to carry out specific processing steps. To carry out the method described herein, the process modules which would be incorporated into a processing system 400 based on a CENTURA® platform which would include, for example and not by way of limitation, a load lock chamber 402 for loading MEMS substrates; a substrate orienter chamber 404; a plasma treatment processing chamber 406, which may be connected to a remote plasma generating source (not shown) or which may include an internal plasma generating system which can be operated under conditions which produce a moderate to low density plasma, for substrate surface cleaning prior to a release process; a cyclic etch/clean chamber 408 in which the movable MEMS parts are released (this chamber may be connected to a remote plasma source which is not shown); a second plasma treatment chamber 410, in which bonded hydroxyl groups are created on the surfaces of released MEMS structures; a cleaning chamber 412, in which excess reaction materials and byproducts from the hydroxyl creation process are removed, typically by solvent treatment; a coating chamber 414 in which a non-stiction coating such as a SAM is applied; and a second loadlock chamber 416, in which the MEMS substrates are unloaded. Since it is possible to carry out release and passivation of MEMS structures without the use of high vacuum (a system that has been evacuated to a pressure below $10^{-3}$ torr), and since pressure can be staged from one handling or processing area to another, it is possible to use a CENTURA® processing platform with an atmospheric load lock, which reduces the overall cost of the system.

FIG. 5 shows another embodiment of a multi-chambered processing system, as a top-view/cross-sectional schematic. In particular, FIG. 5 shows an Applied Materials, Inc. PRODUCER® processing platform, which is used to support a fully automated substrate processing system employing a single substrate, multi-chambered design. This system also includes a computerized process control system (not shown), including a hierarchal process control system of the kind shown in FIG. 8. An advantage of the PRODUCER® processing system is that it permits the use of wet processing as well as dry processing, and enables high vacuum, low vacuum and atmospheric processes. FIG. 5 shows a schematic top view of the processing system 500. Included in processing system 500 are a front end staging area 502, which includes substrate-holding cassettes 509 and a front end substrate handler 513. Substrates (not shown) pass from the front end staging area 502 through a load lock chamber 512 through various passages 510 which include one or more lit valve openings and slit valves, which enable communication between the transfer chamber 519 and other processing chambers, permitting staged vacuum within system 500. For example, a substrate may pass from load lock chamber 512 into transfer chamber 519 through passages 516; and, may pass from transfer chamber 519 into process chamber region 504 into either process chamber 504a or 504b through one of the passageways 514, may pass from transfer chamber 519 into process chamber region 505 into either process chamber 505a or 505b through one of the passageways 518, and may pass from transfer chamber 519 into process chamber region 506, into either process chamber 506a or 506b, through one of the passageways 520. Process chamber regions 504, 505, and 506, may each be under a different pressure condition. Substrate handler 530 facilitates substrate movement from within a central passage 525. Toward the back end of processing system 500 is a housing 508 which houses support utilities (not shown).

To carry out the method described herein, the processing chamber modules which would be incorporated into an PRODUCER® processing system 500 would include, for example and not by way of limitation, a solvent treatment processing chamber 504a; a plasma treatment processing chamber 504b (which may be connected to a remote plasma generating source (not shown) or which may include an internal plasma generating system which can be operated under conditions which produce a moderate to low density plasma, for substrate surface cleaning prior to a release process); two cyclic etch/clean chambers 505a and 505b, in which the movable MEMS parts are released (these chambers may be connected to a remote plasma source which is not shown); a second plasma treatment chamber 506a, in which bonded hydroxyl groups are created on the surfaces of released MEMS structures; and a coating chamber 506b in which a non-stiction coating such as a SAM is applied. Process chamber 504a which is used for an initial cleaning of a MEMS substrate may also be used to remove excess reaction materials and byproducts from the hydroxyl creation process carried out in process chamber 506a.

It is advantageous to have a process tool or apparatus having both atmospheric and sub-atmospheric process chambers or modules in some instances. Another example of such a system is shown in FIG. 6. FIG. 6 is a top view schematic of another multi-chamber processing system of the kind which may be used to carry out the processing described herein; the processing system employs an AXIOM™ platform, and is available from Applied Materials, Inc., Santa Clara, Calif. This processing system may be used to carry out wet processing as well as dry processing, depending on application requirements. As shown in FIG. 6, a process system 600 includes an atmospheric platform 602 and a subatmospheric platform 604. The sub-atmospheric platform 604 and the atmospheric platform 602 are coupled together by two single substrate load locks 606 and 608. Atmospheric platform 602 includes a central atmospheric transfer chamber 610 having a substrate handling device 612, such as a robot contained therein. Also coupled to atmospheric transfer chamber 610 are a front opening unified pod 622 which transfers substrates into atmospheric transfer chamber 610, and a front opening unified pod 624 which transfers finished substrates out of atmospheric transfer chamber 610. Each pod includes a sealable access door 621 for allowing substrates to be transferred into and out of atmospheric transfer chamber 610.

A MEMS substrate (not shown) entering through pod 622 is transferred by substrate handling device 612 to the first processing chamber. The first processing chamber may optionally be a solvent cleaning step used to remove particulates and moisture from the substrate surface. The optional solvent cleaning step may be carried out using a liquid or a vaporous solvent. If a liquid solvent is used, the substrate will be placed into process chamber 634 which is an atmospheric pressure chamber. The MEMS substrate is then treated by surface contact with the liquid solvent to remove particulates and moisture. If a vaporous solvent is used, substrate handling device 612 is used to transfer the substrate through sealable door 605 into substrate load lock 606 and from load lock 606 (which also contains a substrate handling device (not shown) through seatable door 607 into sub-atmospheric transfer chamber 630. From sub-atmospheric transfer chamber 630, the MEMS substrate is placed into a vaporous first surface treatment chamber 614 by a substrate handling device 632, such as a robot contained in sub-atmospheric transfer chamber 630. Within surface treatment chamber 640, the surface of the MEMS substrate is treated using at least one vaporous solvent, to remove contaminants from the surface and to dry the surface of the MEMS substrate. The MEMS substrate is then transferred to first plasma treatment module 616, in which the MEMS substrate surface is exposed to a plasma generated from a source gas comprising oxygen, to further remove contaminants present on the substrate surface. When the etch process is one which utilizes a vaporous etchant and which does not require a plasma etch, the MEMS substrate is transferred by substrate handling device 632 back through load lock 606 into atmospheric transfer chamber 610, and substrate handling device 612 places the MEMS substrate into release chamber 618 or 620. There are two release chambers in processing system 600 because the time to carry out the release step is substantially greater than other process step time requirements. After the release step is carried out, the MEMS substrate is transferred back to the sub-atmospheric transfer chamber 630 and into second plasma chamber 626, where the MEMS substrate surface is treated with a plasma comprising oxygen and a hydrogen source, to create bonded hydroxyl groups on exposed oxidizable surfaces, such as silicon and silicon-germanium surfaces, by way of example and not by way of limitation. From second plasma chamber 626, the MEMS substrate is transferred to first vaporous solvent treatment chamber 628, in which a polar solvent is used to remove residues remaining after creation of the bonded hydroxyl groups on particular MEMS substrate surfaces. (This solvent treatment step may be carried out in the sub-atmospheric portion 604 of system 600 or maybe carried out in the atmospheric portion 602 of system 600, depending on the solvent system used and the pressures used to ensure removal of residues on the surface of the MEMS substrate.) Subsequently, the MEMS substrate is transferred from first vaporous solvent treatment chamber 628 back into the sub-atmospheric transfer chamber 630, and through sealing door 611 by substrate handling device 632, into load lock 608. The MEMS substrate is then passed from load lock 608 through sealing door 609 and into atmospheric transfer chamber 610, from which the substrate is transferred into second solvent treatment chamber 634, in which a non-polar solvent is used to remove polar solvent which may be remaining on the MEMS substrate surface. Subsequently, substrate handling device 612 transfers the MEMS substrate into SAM formation chamber 636, where a SAM is created by reacting a vaporous SAM precursor with bonded hydroxyl groups on the MEMS structure surface. The SAM coated MEMS structure surface may then be vapor phase treated with a solvent-containing gaseous composition to remove any residual SAM precursors. This cleaning process may be carried out in second solvent treatment chamber 634, in first solvent treatment chamber 628, or in a combination of these chambers, depending on the particular SAM which is applied.

All of the operations described above are controlled by the system computer 638 which is coupled to and controls each of the chambers and functional apparatus elements required to carry out each step, and to move the substrates as they progress through the multi-chambered system. Computerized control system 638 enables the feedback from one module/chamber so that the entire system is coordinated to provide maximum efficiency. As a result, each module can be used as near to full capacity as process parameters permit.

The PRODUCER® system shown in FIG. 5 employs a hierarchal process control system of the kind shown in FIG. 8, by way of example and not by way of limitation. The process control system 810 includes a computer program hierarchal control structure in which a user enters a process set number and process chamber number into a process selector subroutine 820 in response to menus or screens displayed on a CRT monitor (not shown) by using a light pen interface (not shown). The process sets provide predetermined sets of process parameters necessary to carry out specified processes, and are identified by predefined set numbers. The process selector subroutine 820 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered in any conventional manner, but most preferably by utilizing the light pen/CRT monitor interface previously mentioned.

Electronic signals provided by various instruments and devices for monitoring the process are provided to the computer through the analog input and digital input boards of the system controller. Any conventional method of monitoring the process chambers can be used, such as polling. Furthermore, electronic signals for operating various process controllers or devices are output through the analog output and digital output boards (not shown) of the system controller 810. The quantity, type and installation of these monitoring and controlling devices may vary from one system to the next, according to the particular end use of the system and the degree of process control desired. The specification or selection of particular devices, such as the optimal type of thermocouple for a particular application, is known by persons with skill in the art.

A process sequencer subroutine 830 comprises program code for accepting the identified process chamber number and set of process parameters from the process selector subroutine 820, and for controlling operation of the various process chambers. Multiple users can enter process set numbers and process chamber numbers, or a user can enter multiple process chamber numbers, so the sequencer subroutine 830 operates to schedule the selected processes in the desired sequence. Preferably, the process sequencer subroutine 830 includes program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. When scheduling which process is to be executed, the sequencer subroutine 830 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 830 determines which process chamber and process set combination is going to be executed next, the sequencer subroutine 830 causes execution of the process set by passing the particular process set parameters to a chamber manager subroutine 840A–C which controls multiple processing tasks in a process chamber 504a, 504b, 505a, 505b, 506a, or 506b, for example, according to the process set determined by the sequencer subroutine 830. For example, the chamber manager subroutine 840A may comprise program code for controlling cyclic etch/clean process operations in the process chambers 505a and 505b. The chamber manager subroutine 840A controls execution of various chamber component subroutines which control operation of the chamber component necessary to carry out the selected process set. Examples of chamber component subroutines are substrate positioning subroutine 850, process gas control subroutine 860, pressure control subroutine 870, heater control subroutine 880, and plasma control subroutine 890. Those having ordinary skill in the art will recognize that other chamber control subroutines can be included depending on what processes are desired to be performed in the process chambers 505a and 505b. In operation, the chamber manager subroutine 840A selectively schedules or calls the process component subroutines in accordance with the particular process set being executed. The chamber manager subroutine 840A schedules the process component subroutines similarly to how the sequencer subroutine 830 schedules which process chamber and process set is to be executed next. Typically, the chamber manager subroutine 840A includes steps of monitoring the various chamber components, determining which components need to be operated based on the process parameters for the process set to be executed, and causing execution of a chamber component subroutine responsive to the monitoring and determining steps.

While the control system illustrated in FIG. 8 describes details only for the 840A chamber manager which controls the process chambers 505a and 505b for the etch/clean process, one skilled in the art will understand that similar process variables can be controlled for other process chambers described with reference to FIG. 5.

II. An Integrated Method for Release and Passivation of a MEMS Structure

According to an exemplary embodiment method of the invention, a substrate including at least one MEMS structure is loaded into a single processing chamber system of the kind used during the initial development of the present invention. An exemplary processing system 300 for use in the present integrated process is illustrated schematically in FIG. 3. One skilled in the art can envision minor variations in apparatus arrangement which can be used to obtain a similar result.

Next, the substrate is contacted with a plasma generated from a first pretreatment source gas comprising oxygen. Oxygen typically makes up about 20 volume % to about 100 volume % of the reaction-generating portion of the plasma source gas.

The first pretreatment source gas may also include $NH_3$. If $NH_3$ is used, the $NH_3$ typically makes up about 0.1 volume % to about 20 volume % of the reaction-generating portion of the plasma source gas. More typically, the $NH_3$ makes up about 0.5 volume % to about 10 volume % of the reaction-generating portion of the first pretreatment source gas. Nitrogen ($N_2$) may be present at about 20 volume % to about 80 volume % of the reaction-generating portion of the plasma source gas.

The first pretreatment source gas may also include a nonreactive diluent gas, such as argon, helium, neon, xenon, krypton, and combinations thereof, for example, and not by way of limitation. The nonreactive diluent gas typically makes up about 20 volume % to about 80 volume % of the first pretreatment source gas, with the remaining 80 volume % to 20 volume % being the reaction-generating portion of the plasma source gas.

Typical processing conditions for the first pretreatment step are as follows: 500–1000 sccm of $O_2$; 5–50 sccm of $NH_3$; 4–10 Torr process chamber pressure; and about 5 kW plasma source power. The first pretreatment step is performed at a substrate temperature within the range of about 20° C. to about 80° C.; more typically, within the range of about 20° C. to about 50° C. Processing time is typically within the range of about 2 minutes to about 3 minutes. The processing conditions set forth above are for use with the plasma processing system shown in schematic in FIG. 3; however, one skilled in the art may use any suitable plasma processing system available in the industry, with appropriate adjustments to the processing conditions.

The plasma is typically generated by an external plasma generation source (indicated by reference numeral 378 in FIG. 3). As used herein, the term "externally generated plasma" or "remote plasma" refers to a plasma which is generated outside of the processing chamber, then piped into the processing chamber (as opposed to an in situ generated plasma, which is generated inside the chamber itself).

A release process is then performed, during which a sacrificial layer present within the MEMS structure is removed. A number of MEMS release processes are known in the art.

An advantageous release process for fabricating a surface within a MEMS structure which is free-moving in response to a stimulus is disclosed in commonly assigned, copending U.S. application Ser. No. 10/046,593, filed Oct. 29, 2001 ("the '593 application"), which is hereby incorporated by reference in its entirety. According to the '593 application, the free-moving surface is fabricated in a series of steps which includes a release process, where release is accomplished by plasmaless etching of a sacrificial layer material, followed by a cleaning step in which byproducts from the etch process and other contaminants which may lead to stiction are removed. There are a series of etch and then clean steps so that a number of "cycles" of these steps are performed. In the cyclic etch/cleaning procedure, a portion of a sacrificial layer is removed, followed by a cleaning step, and the process is repeated until the desired amount of sacrificial layer is removed. The number of etch/clean cycles required in a given instance depends on the dimensions of the free-moving structure which is being fabricated.

In one embodiment of the method disclosed in the '593 application, a micromachined polysilicon actuator is fabricated. During fabrication of the actuator, a starting structure of the kind illustrated in FIG. 1A is used to generate a lever arm 107 of the kind shown in FIG. 1B. The actuator includes an actuation electrical contact pad (not shown). With respect to the FIG. 1A starting structure, a first portion of the upper surface 110 of a silicon substrate 102 is in contact with an overlying layer of silicon oxide 104, while a second portion of the upper surface 110 is in contact with a layer 106 of polysilicon. A portion of the bottom surface 112 of polysilicon layer 106 is also in contact with silicon oxide layer 104, in the area where silicon oxide layer 104 overlies silicon substrate 102, so that polysilicon layer 106 extends over the upper surface 110 of silicon substrate 102. Silicon oxide layer 104 then fills a gap having a height "h", between the upper surface 110 of silicon substrate 102 and the lower surface 112 of polysilicon layer 106. To create the lever arm shown in FIG. 1B, the silicon oxide layer 104 is removed. Thus, this silicon oxide layer 104 is referred to as a "sacrificial" layer.

To prevent the lever arm 107 shown in FIG. 1B from becoming stuck to silicon substrate 102 during fabrication, the etch process used to remove silicon oxide layer 104 must not place undue forces upon lever arm 107 which cause harmful deformation of lever arm 107. In addition, any byproducts and contaminants generated during the etch process which might cause stiction of lever arm 107 to substrate 102 must be removed.

When the sacrificial layer is an oxide, the etchant used to remove the sacrificial layer is typically a fluorine-containing etchant. When the sacrificial layer is an organic polymeric layer, the etchant used to remove the sacrificial layer is typically an oxygen-species containing etchant. When the sacrificial layer is a metal-containing layer, the etchant is typically a chlorine-containing etchant. The etchant is selected to etch the sacrificial layer more rapidly than other layers exposed to the etchant, and to minimize or avoid the formation of chemical compounds which are harmful to the MEMS surfaces which remain after removal of the sacrificial layer. The cleaning agent used depends on the byproducts produced during etching of the sacrificial layer, the ease of removal of the cleaning agent (along with the byproducts which are removed with the cleaning agent), and the surface properties which are generated on the structure surfaces which are contacted by the cleaning agent.

When the sacrificial layer is an oxide, and the structural surfaces adjacent the oxide include at least one of single-crystal silicon (silicon), polysilicon, or silicon nitride, the etchant for removal of the oxide is typically a vapor of an HF/catalyst mixture. The most advantageous catalyst is water, as water provides a faster etch rate; however, other polar molecules which can provide OH$^-$ ions may be used as a catalyst. Examples of other catalysts include chemical compounds which can be present in a vapor state under the same processing conditions at which HF is present in a vapor state, such as chemical compounds having the formula $C_xH_y(OH)_z$, where x ranges from 1–3, y ranges from 3–9 and z ranges from 1–2. Alcohols and ketones work well. Chemical compounds having the formula $C_aH_bO_c$, where a ranges from 1–3, b ranges from 2–8, and c ranges from 2–4, may also be used, such as acetic acid. Typically, the catalyst concentration in the HF/catalyst mixture is less than about 25% by volume. It is important that the HF/catalyst mixture be maintained as a vapor in the process chamber, with the exception of a thin film (a few monolayers) on the surface of the substrate. Thus, the catalyst concentration in the HF/catalyst vapor is dependent on the temperature and pressure under which the etching of the sacrificial oxide layer is carried out.

In the case of an HF/water mixture, where the ratio of HF:water is 10:1 or greater, the substrate temperature during etching is maintained between about 25° C. and about 50° C., and typically is maintained below about 45° C. The temperature of the process chamber walls is generally slightly higher than the substrate temperature, in order to prevent condensation. The pressure in the process chamber is slightly below that which would provide general condensation of the HF/water mixture on the substrate, fine-tuned to provide the thin film monolayer of condensed HF/water mixture on the substrate surface. For process integration reasons, it is helpful when the process chamber is operated at less than one atmosphere of pressure, and the substrate temperature may be adjusted to accommodate operation at such pressure. Desirable operating pressures range between about 300 Torr and about 600 Torr, for example.

The cleaning agent used subsequent to the HF/catalyst etchant mixture is a vaporous chemical compound which is polar in nature. Examples include chemical compounds having the formula $C_xH_y(OH)_z$, where x ranges from 1–3, y ranges from 3–9, and z ranges from 1–2. Methanol, ethanol, and isopropyl alcohol (IPA) have been demonstrated to perform well as cleaning agents. Ketones such as acetone are expected to work well also. Additional example cleaning agents include chemical compounds having the formula $C_aH_bO_c$, where a ranges from 1–3, b ranges from 2–8, and c ranges from 2–4. Acetic acid, which is a compound having this formula, performs well as a cleaning agent.

When the sacrificial layer is an organic polymeric layer, and the structural surfaces adjacent the organic polymeric layer include a metal, the etchant for removal of the organic polymeric sacrificial layer is typically an oxygen-containing active species which oxidizes the polymeric layer into a volatile reaction product which is easily removed from the processing chamber. The cleaning agent used to remove reaction byproducts and contaminants may be one of the cleaning agents described above with reference to the use of an oxide sacrificial layer.

When the sacrificial layer is a metal-containing layer, and the structural surfaces adjacent the metal layer include an oxide, the etchant for removal of the metal sacrificial layer is typically a chlorine-containing active species which reacts with the metal-containing layer to provide volatile reaction products which are easily removed from the processing chamber. The cleaning agent used to remove reaction byproducts and contaminants may be one of the cleaning agents described above with reference to the use of an oxide sacrificial layer.

An important feature is the use of more than one etch/clean cycle to fabricate the free-moving structure, such as a lever arm, beam, membrane, or diaphragm, for example. The number of etch/clean cycles required depends on the feature being etched. For a beam or a lever arm, the cross-sectional dimensions of the arm, the unsupported length of the arm, and the gap between the arm and the underlying substrate are important factors. For a beam or arm having an effective cross-sectional radius in the range of 2 μm or less, the longer the unsupported length of the arm, and the more narrow the gap between the arm and adjacent substrates, the more easily the unsupported arm or beam length can be deformed, and the larger the number of cycles which are necessary to avoid stiction during the fabrication process. The aspect ratio of the gap can be used to estimate the required number of cycles. The aspect ratio of the gap is the ratio of the length of the gap (the unsupported length of the beam or lever arm) to the minimum cross-sectional dimension of the gap. As a starting point, the aspect ratio can be maintained at about 1:1, and the number of cycles used can be nominally in the magnitude of the aspect ratio. For example, if the aspect ratio is 20:1, about 15 to 30 cycles may be used. One skilled in the art can adjust the number of etch/clean cycles depending on the results obtained from this starting point.

Alternative embodiment release processes for fabricating MEMS structures are disclosed in commonly assigned, copending U.S. Provisional Application Ser. No. 60/415,196, filed Sep. 30, 2002 ("the '196 application"), which is incorporated by reference in its entirety and which was discussed above with respect to the processing system 300 shown in FIG. 3. According to one embodiment, a substrate having an oxide sacrificial layer is introduced into the processing chamber and heated to a temperature of about 30° C. to about 55° C. The process chamber pressure is increased to about 900 Torr to about 4000 Torr.

The oxide sacrificial layer is then released to form microstructures by etching the oxide layer with an etchant, which typically includes HF, methanol ($CH_3HO$), and water. HF is typically supplied at a rate of about 1000 sccm to about 4000 sccm. Water is typically supplied at a rate of about 20 sccm to about 100 sccm. Methanol is typically supplied at a rate of about 20 sccm to about 100 sccm. The etch endpoint is typically detected using mass spectrometry or by monitoring the transmission and reflectance of a particular wavelength of light in the infrared range.

In an alternative embodiment release process disclosed in the '196 Application"), a substrate having a silicon sacrificial layer is introduced into the processing chamber and heated to a temperature of about 40° C. to about 55° C. The process chamber pressure is then reduced to about 1 Torr to about 360 Torr, depending on the concentration of the active etchant to be used.

The silicon sacrificial layer is then released to form microstructures by etching the silicon layer with an etchant, which typically includes $XeF_2$. $XeF_2$ is typically delivered at a rate of about 10 sccm to about 20 sccm, in a carrier gas of $N_2$, helium, argon, or neon. Alternatively, the etchant may be a plasma generated from a source gas comprising $NF_3$. $NF_3$ is typically delivered at a rate of about 100 sccm to about 500 sccm. The etch endpoint is typically detected using mass spectrometry.

After performing a release process using one of the methods known in the art, it is often desirable to apply a coating over the substrate which will prevent stiction during handling and use of the device. Self-assembled monolayer (SAM) coatings are known in the art. Self-assembly is a process in which a single, densely packed molecular layer of a material is selectively deposited on a fresh reactive surface. The process self-terminates after single layer coverage is achieved. SAM coatings are typically deposited from precursor long-chain hydrocarbons or fluorocarbons with a chlorosilane-based head, such as alkylchlorosilanes. Effective alkylchlorosilanes include OTS (octadecyltrichlorosilane; $C_{18}H_{37}SiCl_3$), FDTS (perfluorodecyltrichlorosilane; $C_{10}H_4F_{17}SiCl_3$), and DMDS (dimethyldichlorosilane; $(CH_3)_2SiCl_2$), for example and not by way of limitation. The chemical structures of OTS and FDTS are shown in FIG. 2A (respectively indicated by reference numerals 200 and 210).

To improve the adhesion, prior to the application of a SAM coating, a second pretreatment step is performed in which surfaces of the MEMS structure are contacted with a plasma which was generated from a source gas comprising oxygen and, optionally, a source of hydrogen. The treatment oxidizes the surfaces, which are then reacted with hydrogen to form bonded OH groups on the surfaces. The hydrogen source may be present as part of the plasma source gas, so that the bonded OH groups are created during treatment of the surfaces with the plasma. Examples of hydrogen sources include $NH_3$ or steam, by way of example and not by way of limitation. In the alternative, the plasma-treated, oxidized surfaces may be subsequently exposed to a gas containing a source of hydrogen, such as a mixture of hydrogen with an inert gas, or $NH_3$, so that the oxidized surface reacts with the hydrogen to create bonded OH groups on the MEMS surfaces.

The plasma used to oxidize the MEMS structure surface should have a plasma density of about $1\times10^8$ $e^-/cm^3$ or less at the substrate surface, and the plasma treatment should be carried out without a bias applied to the substrate. Typically, the plasma density is within the range of about $1\times10^7$ $e^-/cm^3$ to about $1\times10^8$ $e^-/cm^3$ at the substrate surface.

Typically, the plasma used to treat the MEMS structure surfaces is an externally generated plasma. The use of an external plasma generation source provides the ability to control the plasma to exhibit a low, yet uniform, ion density, preventing undesirable etching and/or ion bombardment of the MEMS structure surface during oxidation of the surface. The plasma typically has an ion density of about $1\times10^{10}$ $e^-/cm^3$ to about $1\times10^{12}$ $e^-/cm^3$ at the plasma generation source; however, the ion density of the plasma is permitted to drop off to about $1\times10^7$ $e^-/cm^3$ to about $1\times10^8$ $e^-/cm^3$ by the time the plasma reaches the substrate surface. One skilled in the art to which the present invention belongs will be able to control the holding time or stabilization time of the plasma prior to contacting the substrate surface in order to ensure that the plasma density at the substrate surface is within a desired range.

The plasma pretreatment process of the invention is a very gentle, isotropic process which is performed for the sole purpose of preparing the surface for reaction with a SAM precursor, such as the chlorosilane head of an alkylchlorosilane. The highly isotropic process allows all exposed surfaces of the MEMS structure to be contacted with the plasma. The treatment oxidizes the surfaces, which are then reacted with hydrogen to form bonded OH groups on the surfaces. The surfaces may be silicon-containing surfaces or other surfaces within a MEMS structure, including, but not limited to, metal-containing surfaces. FIG. 2B shows a hydrolyzed surface 220 of a MEMS structure.

In general, an oxidant is diffused toward the MEMS structure. The oxidant is preferably in a vapor-phase, and can comprise, for example, one or both of OH radicals and steam. The oxidant oxidizes exposed surfaces of the MEMS structure. If OH radicals are utilized for the oxidation of MEMS structure surfaces, the OH radicals can be generated by subjecting a precursor (such as, for example, water) to a plasma. Preferably, the plasma is generated remotely relative to the processing chamber, such that the plasma does not contact exposed surfaces of the MEMS structure during generation of the OH radicals. The substrate can be subjected to a water rinse after exposure to OH radicals, and, depending on the precursor utilized to generate the radicals, such rinse may or may not be desired.

Oxygen typically makes up about 20 volume % to about 80 volume % of the reaction-generating portion of the pretreatment plasma source gas. The source of hydrogen is typically $NH_3$ or steam, by way of example, and not by way of limitation. If $NH_3$ is used, the $NH_3$ typically makes up about 0.1 volume % to about 20 volume % of the reaction-generating portion of the plasma source gas. More typically, the $NH_3$ makes up about 0.5 volume % to about 10 volume % of the reaction-generating portion of the plasma source gas. The presence of nitrogen in the plasma source gas speeds up the rate of oxidation. Nitrogen ($N_2$) may be present at about 20 volume % to about 80 volume % of the reaction-generating portion of the plasma source gas.

The plasma source gas may also include a nonreactive diluent gas, such as argon, helium, neon, xenon, krypton, and combinations thereof, for example, and not by way of limitation. The nonreactive diluent gas typically makes up about 20 volume % to about 80 volume % of the plasma source gas, with the remaining 80 volume % to 20 volume % being the reaction-generating portion of the plasma source gas.

Typical processing conditions for the second pretreatment step are as follows: 500–1000 sccm of $O_2$; 5–50 sccm of $NH_3$; 4–10 Torr process chamber pressure; and about 5 kW plasma source power. The second pretreatment step is performed at a substrate temperature within the range of about 20° C. to about 80° C.; more typically, within the range of about 20° C. to about 50° C. Processing time is typically within the range of about 3 minutes to about 5 minutes. The processing conditions set forth above are for use with the plasma processing system shown in schematic in FIG. 3; however, one skilled in the art may use any suitable plasma processing system available in the industry, with appropriate adjustments to the processing conditions.

In an alternative embodiment, the MEMS structure is first treated with a plasma which was generated from a source gas comprising oxygen, followed by exposure of the surfaces to a hydrogen source, such as $NH_3$, steam, or $H_2O$, by way of example, and not by way of limitation. The treatment oxidizes the surfaces, which are reacted with hydrogen, in a subsequent processing step, to form bonded OH groups on the surfaces.

A SAM coating is then applied to exposed surfaces of the MEMS structure by contacting the surfaces with vapor-phase alkylsilane-containing molecules (such as OTS, FDTS, and DMDS). These reagents are introduced into the processing chamber by bubbling an anhydrous, inert gas through a liquid source of the alkylsilane-containing reagent to transport the reagent in vapor phase into the reaction chamber. In the alternative, a Direct Liquid Inject™ system may be used in which the flow rates of the reagents are measured as a liquid, and then the liquids are vaporized just prior to insertion into the processing chamber, with inert carrier gas being fed into a port of the vaporizer. Typically, the reaction between the alkylsilane and the exposed substrate surfaces is carried out at a substrate temperature ranging from about 20° C. to about 80° C. (more typically, from about 20° C. to about 50° C.), at a pressure ranging from about 800 mTorr to about 2 Torr. The pressure is low because it is desired to produce only a single monolayer on the substrate surface. This reaction may also be carried out in the same processing chamber as that described with reference to the etch/clean cycle steps and the oxidation step, providing a process integration which provides significant production cost savings.

During application of a SAM coating, the chlorosilane-based head of an alkylchlorosilane, shown as 212 in FIG. 2A, reacts with the hydrolyzed surface, shown as 220 in FIG. 2B, liberating one molecule of HCl for each Si—Cl bond that is hydrolyzed. FIG. 2C shows a MEMS surface 230 on which a self-assembled monolayer of individual FDTS molecules 210 has been grown. A similar structure may be achieved for a self-assembled monolayer of individual OTS molecules.

During application of the SAM coating to surfaces of the MEMS structure, a SAM coating typically also forms on surfaces of the processing chamber. This SAM coating needs to be removed from surfaces of the processing chamber prior to the performance of subsequent processing steps within the chamber. Therefore, after removal of the substrate from the chamber, the present method typically also includes a chamber cleaning step, comprising contacting surfaces of the processing chamber with a plasma generated from a source gas comprising oxygen, whereby residual SAM is removed from processing chamber surfaces. Typical processing conditions for the chamber cleaning step are as follows: 500–1000 sccm of $O_2$; 4–10 Torr process chamber pressure; and about 5 kW plasma source power. The chamber cleaning step is performed at a temperature within the range of about 20° C. to about 80° C.; more typically, within the range of about 20° C. to about 50° C. Processing time is typically within the range of about 5 minutes to about 10 minutes. The processing conditions set forth above are for use with the plasma processing system shown in schematic in FIG. 3; however, one skilled in the art may use any suitable plasma processing system available in the industry, with appropriate adjustments to the processing conditions.

A higher density plasma can be used during the chamber cleaning step than during the first and second pretreatment steps, because it is no longer necessary to avoid ion bombardment of the substrate (which has been removed from the chamber). Typically, the ion density of the plasma in the chamber during the cleaning step is within the range of about $1 \times 10^7$ $e^-/cm^3$ to about $1 \times 10^{11}$ $e^-/cm^3$.

FIG. 7 is a process flow diagram showing one embodiment of the present invention which includes particularly advantageous steps which may be used in release and passivation of a MEMS structure, and which correlates with the efficient use of a multi-chamber processing system. The various process conditions described with reference to use of a single chamber processing chamber system may be used in the multiple-chamber processing system as well, and will not be described below. However, it should be mentioned that the efficiencies produced by use of a multi-chambered system permits some adjustments in terms of processing conditions, which will be readily apparent to one skilled in chemical and plasma processing operations. With respect to FIG. 7, step (1) is optional but helpful in ensuring a cleaner surface prior to the Release process. In step (1), a vapor phase solvent or a liquid solvent treatment is carried out to remove contaminants from the MEMS structure surface and to aid in the removal of moisture. In step (2) the MEMS structure surface is treated using an oxygen-comprising plasma, to further remove contaminants from the MEMS structure surface. In step (3), the Release process is carried out, in which sacrificial materials are removed to free moving elements of the MEMS structure. The Release process is typically a cyclic etch/clean process which is carried out a number of times until the sacrificial material and residues thereof are completely removed, as previously described. In step (4), the surface oxidation and hydrogen treatment to create bonded hydroxyl groups on silicon-containing MEMS structure surfaces is carried out. In step (5), a vapor phase treatment with a polar solvent is used to remove residues from the step (4) reaction in which bonded hydroxyl groups were created on particular MEMS surfaces. In step (6) a second vapor phase treatment with a non-polar solvent is used to remove residues of the polar solvent present after step (5). In step (7), the precursor reactants necessary to form the SAM are contacted with the bonded hydroxyl groups created in step (4), to produce a SAM coating on the MEMS surfaces having the bonded hydroxyl groups present. In optional step (8) at least one vapor phase solvent treatment is used to remove residual SAM precursor reactants from the MEMS structure surface.

The steps which are illustrated in the process flow diagram of FIG. 7 can be carried out in two or more chambers, depending on the ranges of the various process variables involved, and the compatibility of the chemistry. For example, steps (1) through (6) may be carried out in one process chamber which can meet the general requirements for all of the process variables necessary to carry out these steps, while steps (7) and (8) are carried out in a second process chamber. In the alternative, steps (1), (5) and (6) could be carried out in one process chamber, with steps (2)–(4) carried out in a second process chamber, and with steps (7) and (8) carried out in a third process chamber.

The above described embodiments are not intended to limit the scope of the present invention, as one skilled in the art can, in view of the present disclosure, expand such embodiments to correspond with the subject matter of the invention claimed below.

We claim:

1. An apparatus for carrying out a method of release and passivation of a MEMS structure, which method reduces stiction in a released element of said MEMS structure, said apparatus comprising:
   a) a memory that stores instructions for an integrated method of release and passivation of a MEMS structure;
   b) a processor adapted to communicate with said memory and to execute said instructions stored by said memory;
   c) at least one plasma processing chamber adapted to carry out said integrated method of release and passivation of said MEMS structure in accordance with the following method,
      i) treating a surface of said MEMS structure by contacting said surface with a plasma generated from a first source gas comprising oxygen;
      ii) carrying out a release process, during which a sacrificial layer present within said MEMS structure is removed by etching;
      iii) an oxidation step, comprising contacting surfaces of said MEMS structure with a plasma generated from a second source gas comprising oxygen;
      iv) a hydrolysis step, comprising contacting surfaces of said MEMS structure with a source of hydrogen; and
      v) applying a reactive vapor phase precursor for a self-assembled monolayer (SAM) coating to exposed surfaces of said MEMS structure, whereby a hydrophobic SAM is produced on surfaces which were hydrolyzed in step iv); and
   d) a port adapted to pass communications between said processor and said at least one plasma processing chamber.

2. A multi-chamber processing system for carrying out an integrated method of obtaining release and passivation of a MEMS structure, said multi-chamber processing system comprising:
   a) a memory that stores instructions for an integrated method of release and passivation of a MEMS structure;
   b) a processor adapted to communicate with said memory and to execute said instructions stored by said memory;
   c) said multi-chamber processing system for carrying out said integrated method of release and passivation of said MEMS structure in accordance with the following method,
      i) placing said MEMS structure in a first processing chamber of said multi-chamber processing system;
      ii) treating a surface of said MEMS structure in said first processing chamber by contacting said surface with a plasma generated from a first source gas comprising oxygen;
      iii) placing said MEMS structure in a second processing chamber of said multi-chamber processing system;
      iv) carrying out a release process, during which a sacrificial layer present within said MEMS structure is removed by a cyclic etch/clean operation which is performed a plurality of times in said second processing chamber;
      v) placing said MEMS structure in a third processing chamber of said multi-chamber processing system;
      vi) contacting oxidizable surfaces of said MEMS structure with a plasma generated from a second source gas comprising oxygen and a source of hydrogen;
      vii) placing said MEMS structure in a fourth processing chamber of said multi-chamber processing system; and
      viii) applying a reactive vapor phase precursor for a self-assembled monolayer (SAM) coating to exposed surfaces of said MEMS structure, whereby a hydrophobic SAM is produced on surfaces which were hydroxylated in step vi); and
   d) a port adapted to pass communications between said processor and at least one plasma processing chamber within said multi-chamber processing system.

3. An apparatus in accordance with claim 2, wherein said method recited in step c) includes the following steps subsequent to step viii):
  ix) placing said MEMS structure in a fifth processing chamber in said multi-chamber processing system; and
  x) removing residual reactants and reaction by-products from step viii) using a vapor phase treatment with a solvent for said residual reactants and said reaction by-products.

4. A multi-chamber processing system for carrying out an integrated method of obtaining release and passivation of a MEMS structure, said multi-chamber processing system comprising:
  a) a memory that stores instructions for an integrated method of release and passivation of a MEMS structure;
  b) a processor adapted to communicate with said memory and to execute said instructions stored by said memory;
  c) said multi-chamber processing system for carrying out said integrated method of release and passivation of said MEMS structure in accordance with the following method,
    i) placing said MEMS structure in a first processing chamber of said multi-chamber processing system;
    ii) treating a surface of said MEMS structure in said first processing chamber by contacting said surface with a plasma generated from a first source gas comprising oxygen;
    iii) placing said MEMS structure in a second processing chamber of said multi-chamber processing system;
    iv) carrying out a release process, during which a sacrificial layer present within said MEMS structure is removed by a cyclic etch/clean operation which is performed a plurality of times in said second processing chamber;
    v) placing said MEMS structure in a third processing chamber of said multi-chamber processing system;
    vi) contacting oxidizable surfaces of said MEMS structure with a plasma generated from a second source gas comprising oxygen and a source of hydrogen;
    vii) placing said MEMS structure in a fourth processing chamber of said multi-chamber processing system;
    viii) treating said MEMS structure with at least one solvent which is in vapor phase to remove residues created during step vi);
    ix) placing said MEMS structure in a fifth processing chamber of said multi-chamber processing system; and
    x) applying a reactive vapor phase precursor for a self-assembled monolayer (SAM) coating to exposed surfaces of said MEMS structure, whereby a hydrophobic SAM is produced on surfaces which were hydroxylated in step vi); and
  d) a port adapted to pass communications between said processor and at least one plasma processing chamber within said multi-chamber processing system.

5. An apparatus in accordance with claim 4, wherein said method recited in step c) includes the following steps subsequent to step x):
  xi) placing said MEMS structure in a fifth processing chamber in said multi-chamber processing system; and
  xii) removing residual reactants and reaction by-products from step x) using a vapor phase treatment with a solvent for said residual reactants and said reaction by-products.

6. An article of manufacture used to carry out a method of release and passivation of a MEMS structure, which method reduces stiction in a released element of said MEMS structure, said article of manufacture comprising:
  a recordable medium having recorded thereon a plurality of programming instructions used to program an apparatus which is used to carry out an integrated method of release and passivation of a MEMS structure in accordance with the following method,
    i) treating a surface of said MEMS structure by contacting said surface with a plasma generated from a first source gas comprising oxygen;
    ii) carrying out a release process, during which a sacrificial layer present within said MEMS structure is removed by etching;
    iii) an oxidation step, comprising contacting surfaces of said MEMS structure with a plasma generated from a second source gas comprising oxygen;
    iv) a hydrolysis step, comprising contacting surfaces of said MEMS structure with a source of hydrogen; and
    v) applying a reactive vapor phase precursor for a self-assembled monolayer (SAM) coating to exposed surfaces of said MEMS structure, whereby a hydrophobic SAM is produced on surfaces which were hydrolyzed in step iv).

7. An article of manufacture for use in combination with a multi-chamber processing system for carrying out an integrated method of obtaining release and passivation of a MEMS structure, said article of manufacture comprising:
  a recordable medium having recorded thereon a plurality of programming instructions used to program an apparatus which is used to carry out an integrated method of release and passivation of a MEMS structure in accordance with the following method,
    i) placing said MEMS structure in a first processing chamber of said multi-chamber processing system;
    ii) treating a surface of said MEMS structure in said first processing chamber by contacting said surface with a plasma generated from a first source gas comprising oxygen;
    iii) placing said MEMS structure in a second processing chamber of said multi-chamber processing system;
    iv) carrying out a release process, during which a sacrificial layer present within said MEMS structure is removed by a cyclic etch/clean operation which is performed a plurality of times in said second processing chamber;
    v) placing said MEMS structure in a third processing chamber of said multi-chamber processing system;
    vi) contacting oxidizable surfaces of said MEMS structure with a plasma generated from a second source gas comprising oxygen and a source of hydrogen;
    vii) placing said MEMS structure in a fourth processing chamber of said multi-chamber processing system; and
    viii) applying a reactive vapor phase precursor for a self-assembled monolayer (SAM) coating to exposed surfaces of said MEMS structure, whereby a hydrophobic SAM is produced on surfaces which were hydroxylated in step vi).

8. An article of manufacture according to claim 7, wherein said method recited includes the following additional steps subsequent to step viii):
  ix) placing said MEMS structure in a fifth processing chamber in said multi-chamber processing system; and
  x) removing residual reactants and reaction by-products from step viii) using a vapor phase treatment with a solvent for said residual reactants and said reaction by-products.

9. An article of manufacture for use in combination with a multi-chamber processing system for carrying out an integrated method of obtaining release and passivation of a MEMS structure, said article of manufacture comprising:

a recordable medium having recorded thereon a plurality of programming instructions used to program an apparatus which is used to carry out an integrated method of release and passivation of a MEMS structure in accordance with the following method,
i) placing said MEMS structure in a first processing chamber of said multi-chamber processing system;
ii) treating a surface of said MEMS structure in said first processing chamber by contacting said surface with a plasma generated from a first source gas comprising oxygen;
iii) placing said MEMS structure in a second processing chamber of said multi-chamber processing system;
iv) carrying out a release process, during which a sacrificial layer present within said MEMS structure is removed by a cyclic etch/clean operation which is performed a plurality of times in said second processing chamber;
v) placing said MEMS structure in a third processing chamber of said multi-chamber processing system;
vi) contacting oxidizable surfaces of said MEMS structure with a plasma generated from a second source gas comprising oxygen and a source of hydrogen;
vii) placing said MEMS structure in a fourth processing chamber of said multi-chamber processing system;
viii) treating said MEMS structure with at least one solvent which is in vapor phase to remove residues created during step vi);
ix) placing said MEMS structure in a fifth processing chamber of said multi-chamber processing system; and
x) applying a reactive vapor phase precursor for a self-assembled monolayer (SAM) coating to exposed surfaces of said MEMS structure, whereby a hydrophobic SAM is produced on surfaces which were hydroxylated in step vi).

10. An article of manufacture according to claim 9, wherein said method recited includes the following additional steps subsequent to step x):
xi) placing said MEMS structure in a fifth processing chamber in said multi-chamber processing system; and
xii) removing residual reactants and reaction by-products from step x) using a vapor phase treatment with a solvent for said residual reactants and said reaction by-products.

* * * * *